(12) United States Patent
Kakugawa et al.

(10) Patent No.: US 6,853,281 B1
(45) Date of Patent: Feb. 8, 2005

(54) MAGNET APPARATUS AND MRI APPARATUS

(75) Inventors: Shigeru Kakugawa, Hitachi (JP); Shouji Kitamura, Mito (JP); Nobuhiro Hara, Hitachi (JP); Akiyoshi Komura, Hitachi (JP); Noriaki Hino, Mito (JP); Hajime Kawano, Hitachinaka (JP); Takao Honmei, Hitachinaka (JP); Hirotaka Takeshima, Ryugasaki (JP); Takeshi Yatsuo, Kashiwa (JP); Hiroshi Tazaki, Kashiwa (JP)

(73) Assignees: Hitachi Medical Corporation, Tokyo (JP); Hitachi, Ltd., Tokyo (JP)

(*) Notice: Subject to any disclaimer, the term of this patent is extended or adjusted under 35 U.S.C. 154(b) by 0 days.

(21) Appl. No.: 09/554,155

(22) PCT Filed: Dec. 1, 1998

(86) PCT No.: PCT/JP98/05406

§ 371 (c)(1),
(2), (4) Date: Aug. 22, 2000

(87) PCT Pub. No.: WO99/27851

PCT Pub. Date: Jun. 10, 1999

(30) Foreign Application Priority Data

Dec. 1, 1997 (JP) ............................................... 9-329857

(51) Int. Cl.[7] ................................................. G01V 3/00
(52) U.S. Cl. ...................... 335/296; 335/216; 335/299; 335/301; 324/319; 324/320
(58) Field of Search ......................... 335/216, 296–301; 324/318–320

(56) References Cited

U.S. PATENT DOCUMENTS 5,410,287 A    4/1995  Laskaris et al. ............ 335/216
5,517,168 A *  5/1996  Dorri et al. ................. 335/301
5,581,223 A * 12/1996  Ono et al. .................. 335/301
5,721,523 A *  2/1998  Dorri et al. ................. 335/216

FOREIGN PATENT DOCUMENTS

| JP | 6346704 | 2/1988 |
| JP | 3141619 | 6/1991 |
| JP | 7106153 | 4/1995 |
| JP | 838453  | 2/1996 |
| JP | 9153408 | 6/1997 |
| JP | 9187439 | 7/1997 |

* cited by examiner

Primary Examiner—Ramon M. Barrera
(74) Attorney, Agent, or Firm—Cooper & Dunham LLP

(57) ABSTRACT

A magnet device includes two sets of static magnetic field generation sources spaced from each other in the vertical direction such that the uniform magnetic field region (patient space) is between then. Each set has concentric current carrying coils to generate a uniform magnetic field in a first direction (the vertical direction). Several such coils are used in each set, disposed such that when a first axis which is parallel to the first (vertical) direction and passes substantially through the centers of the current carrying coils crosses, at a first point, a second axis which is orthogonal to the first axis and is at substantially equal distance from the respective static magnetic field generation sources, the current carrying coils are disposed in such a manner that when geometrical centers of cross sections of the current carrying coils are projected on a first straight line that is in a first plane containing the first axis, the second axis and the first point and passing through the first point, the directions of the currents of the carrying coils at the respective corresponding projections align alternatively in positive and negative directions on the first straight line.

65 Claims, 12 Drawing Sheets

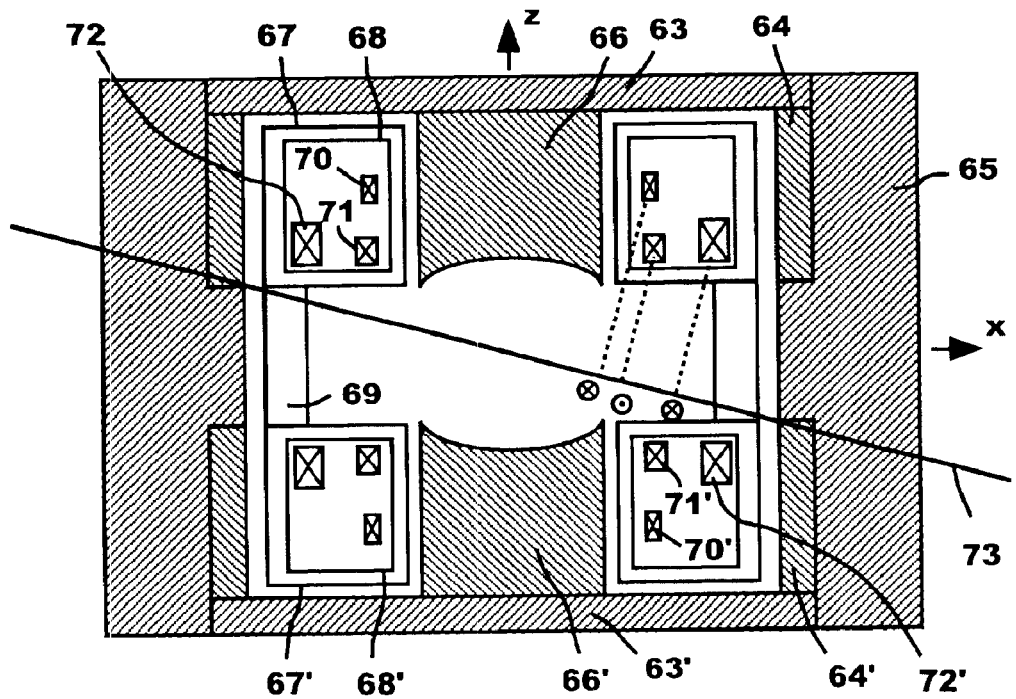
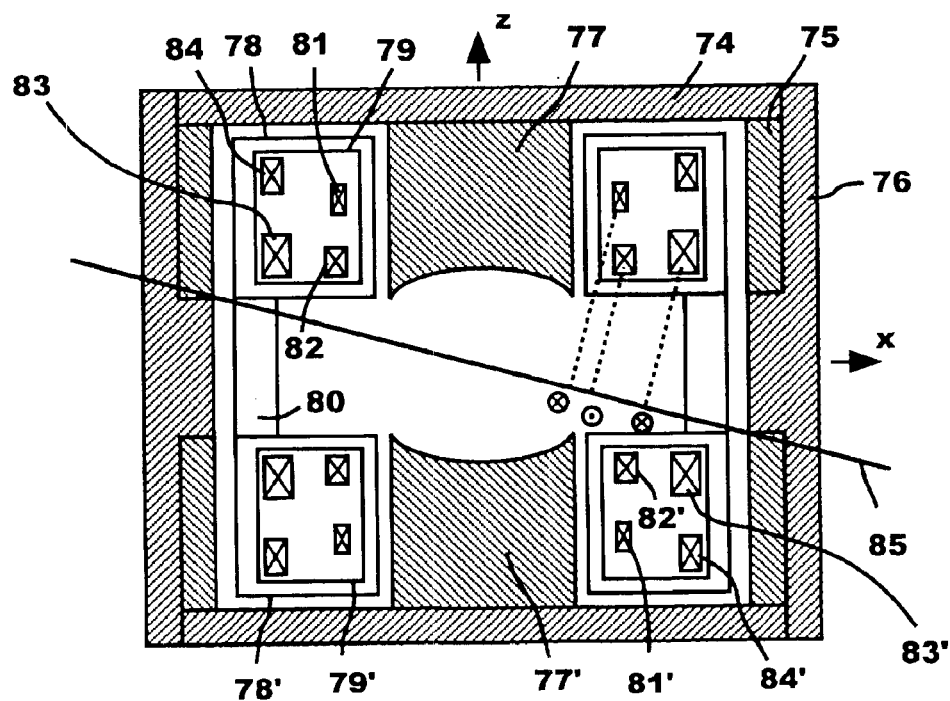

MAGNET APPARATUS AND MRI APPARATUS

FIELD OF THE INVENTION

The present invention relates to a super conducting magnet which is suitable for a nuclear magnetic resonance imaging (hereinafter, simply called as MRI) device, and, more specifically, relates to a super conducting magnet device which is provided with a broad opening as well as makes easy to access to a measurement object by reducing the outer diameter of the magnet.

BACKGROUND ART

Conventionally, it was difficult that a person performing inspection such as a medical doctor accesses a person under inspection during image taking with an MRI device, therefore, the so called Interventional Radiology (hereinafter, simply called as IVR) was as well as difficult.

For example, JP-A-7-106153 (1995) entitled "C Type Super Conducting Magnet" discloses a conventional art for avoiding the above problems.

The above referred to device takes MRI images after inserting a patient between two magnetic poles.

This device is for generating a uniform magnetic field by optimizing the configuration of the magnetic poles, however, because of weight limitation thereof, a uniform magnetic field space which can be used merely for inspecting a head portion of the patient is generally created.

However, in a case of whole-body use MRI device which permits an image taking of such as the abdomen, the chest and the bi-shoulder of a patient representing an inspection object without moving the patient during image taking, it is generally necessary to generate a uniform magnetic field with intensity variation of a few ppm (for example 2~3 ppm) in an image taking region covered by a sphere having a diameter from 40 cm to more than 50 cm. Accordingly, it is required to develop an MRI device having a magnet which can generates a uniform magnetic field with its intensity variation of a few ppm (for example, 2~3 ppm) in an image taking region covered by a sphere having a diameter from 40 cm to more than 50 cm while keeping a highly open space feeling in the magnet for an MRI device.

As has been explained above, it was difficult until now to generate a uniform magnetic field over a broad region in a magnet having a broad opening which gives an open space feeling for a person to be inspected (a patient) representing a measurement (image taking) object. Further, there is a problem to have to increase the outer diameter of the magnet in order to obtain a broad uniform magnetic field space, which causes other problems to deteriorate the open space feeling for the patient and easy access thereto. Still further, when it is intended to enlarge the uniform magnetic field region, which causes a problem of increasing the manufacturing cost of the magnet because the absolute value of magnetomotive forces of coils constituting the magnet has to be increased.

Further, JP-A-3-141619 (1991) discloses a magnet for generating a uniform magnetic field in a broad region in which currents in opposite directions are flown through two coils disposed in outside and inside along a same axis to generate magnetic fields in opposite direction and to superposed the same each other, thereby, a non-uniformity of magnetic field produced by a single coil is canceled out to enlarge a uniform magnetic field region.

Further, JP-A-9-153408 (1997) applied by the present applicants discloses a super conducting magnet device each of a pair of static magnetic field generation sources disposed in vertical direction so as to oppose each other is constituted so as to include one main coil unit for generating static magnetic field and a plurality of coil units for correcting irregular magnetic field, however, JP-A-9-153408 (1997) does not disclose specifically the DC current flow direction in these two sorts of unit coils.

SUMMARY OF THE INVENTION

An object of the present invention is to provide a super conducting magnet with a broad opening used for unclear magnetic resonance which generates a desirable uniform magnetic field in comparison with a conventional magnet and shows a high open space feeling through a small outer diameter of the magnet.

A first aspect of the magnet device according to the present invention which achieves the above object and in which two sets of static magnetic field generation sources, each being constituted by current carrying means disposed substantially concentrically with respect to a first direction in order to generate a uniform magnetic field directing in the first direction in a finite region, are disposed facing each other while placing the uniform magnetic field region therebetween and each of the static magnetic field generation sources is provided with at least four current carrying means, is characterized in that when assuming a crossing point of a first axis which is in parallel with the first direction and passes substantially the center of the current carrying means and a second axis which crosses the first axis orthogonally and locates at substantially the equal distance from the two sets of the static magnetic field generation sources as a first point and further assuming a first straight line contained on a first plane defined by the first axis, the second axis and the first point and passing through the first point, the current carrying means are disposed in such a manner that, when geometrical centers of cross sections of the current carrying means on the first plane are projected on the first straight line, the current carrying direction of the current carrying means corresponding to the respective projections of each of the static magnetic field generation sources aligns alternatively in positive and negative direction.

A second aspect of the magnet device according to the present invention in which two sets of static magnetic field generation sources, each being constituted by current carrying means and shielding current carrying means for suppressing leakage magnetic field to an external region disposed substantially concentrically with respect to a first direction in order to generate a uniform magnetic field directing in the first direction in a finite region, are disposed facing each other while placing the uniform magnetic field region therebetween and each of the static magnetic field generation sources is provided with at least four current carrying means and at least one shielding current carrying means, is characterized in that when assuming a crossing point of a first axis which is in parallel with the first direction and passes substantially the center of the current carrying means and a second axis which crosses the first axis orthogonally and locates at substantially the equal distance from the two sets of the static magnetic field generation sources as a first point and further assuming a first straight line contained on a first plane defined by the first axis, the second axis and the first point and passing through the first point, the current carrying means are disposed in such a manner that, when geometrical centers of cross sections of the current carrying means on the first plane are projected on the first straight line, the current carrying direction of the current carrying means corresponding to the respective projections of each of the static magnetic field generation sources aligns alternatively in positive and negative direction.

A third aspect of the magnet device according to the present invention in which two sets of static magnetic field generation sources, each being constituted by current carrying means disposed substantially concentrically with respect to a first direction in order to generate a uniform magnetic field directing in the first direction in a finite region, are disposed facing each other while placing the uniform magnetic field region therebetween and each of the static magnetic field generation sources is provided with a ferromagnetic body functioning as a magnetic pole and at least two current carrying means, is characterized in that when assuming a crossing point of a first axis which is in parallel with the first direction and passes substantially the center of the current carrying means and a second axis which crosses the first axis orthogonally and locates at substantially the equal distance from the two sets of the static magnetic field generation sources as a first point and further assuming a first straight line contained on a first plane defined by the first axis, the second axis and the first point and passing through the first point, the current carrying means are disposed in such a manner that, when geometrical centers of cross sections of the current carrying means on the first plane are projected on the first straight line, the current carrying direction of the current carrying means corresponding to the respective projections of each of the static magnetic field generation sources aligns alternatively in positive and negative direction.

A fourth aspect of the magnet device according to the present invention in which two sets of static magnetic field generation sources, each being constituted by current carrying means and shielding current carrying means for suppressing leakage magnetic field to an external region disposed substantially concentrically with respect to a first direction in order to generate a uniform magnetic field directing in the first direction in a finite region, are disposed facing each other while placing the uniform magnetic field region therebetween and each of the static magnetic field generation sources is provided with a ferromagnetic body functioning as a magnetic pole, at least two current carrying means and at least one shielding current carrying means, is characterized in that when assuming a crossing point of a first axis which is in parallel with the first direction and passes substantially the center of the current carrying means and a second axis which crosses the first axis orthogonally and locates at substantially the equal distance from the two sets of the static magnetic field generation sources as a first point and further assuming a first straight line contained on a first plane defined by the first axis, the second axis and the first point and passing through the first point, the current carrying means are disposed in such a manner that, when geometrical centers of cross sections of the current carrying means on the first straight line, the current carrying direction of the current carrying means corresponding to the respective projections of each of the static magnetic field generation sources aligns alternatively in positive and negative direction.

A fifth aspect of the magnet device according to the present invention in which two sets of static magnetic field generation sources, each being constituted by current carrying means disposed substantially concentrically with respect to a first direction in order to generate a uniform magnetic field directing in the first direction in a finite region, are disposed facing each other while placing the uniform magnetic field region therebetween and each of the static magnetic field generation sources is provided with three current carrying means, is characterized in that when assuming a crossing point of a first axis which is in parallel with the first direction and passes substantially the center of the current carrying means and a second axis which crosses the first axis orthogonally and locates at substantially the equal distance from the two sets of the static magnetic field generation sources as a first point and further assuming a first straight line contained on a first plane defined by the first axis, the second axis and the first point and passing through the first point, the current carrying means are disposed in such a manner that, when geometrical centers of cross sections of the current carrying means on the first plane are projected on the first straight line, the current carrying direction of the current carrying means corresponding to the respective projections of each of the static magnetic field generation sources aligns alternatively in positive and negative direction.

A sixth aspect of the magnet device according to the present invention in which two sets of static magnetic field generation sources, each being constituted by current carrying means and shielding current carrying means for suppressing leakage magnetic field to an external region disposed substantially concentrically with respect to a first direction in order to generate a uniform magnetic field directing in the first direction in a finite region, are disposed facing each other while placing the uniform magnetic field region therebetween and each of the static magnetic field generation sources is provided with three current carrying means and at least one shielding current carrying means, is characterized in that when assuming a crossing point of a first axis which is in parallel with the first direction and passes substantially the center of the current carrying means and a second axis which crosses the first axis orthogonally and locates at substantially the equal distance from the two sets of the static magnetic field generation sources as a first point and further assuming a first straight line contained on a first plane defined by the first axis, the second axis and the first point and passing through the first point, the current carrying means are disposed in such a manner that, when geometrical centers of cross sections of the current carrying means on the first plane are projected on the first straight line, the current carrying direction of the current carrying means corresponding to the respective projections of each of the static magnetic field generation sources aligns alternatively in positive and negative direction.

Now, magnetic field in a magnet used in an MRI device will be explained thereinbelow.

When assuming that the center axis of the magnet device is z axis, r and $\theta$ represent a coordinate position in a polar coordinate assuming the center of the magnet device as origin and $P_n(\cos\theta)$ is Legendre's function of nth degree, magnetic field Bz in z direction near the center portion of the magnet device can generally be developed and expressed in the following equation (1);

$$Bz = \sum_{n=0}^{\infty} d_n r^n P_n(\cos\theta) \quad (1)$$

wherein $d_0$ is a uniform magnetic field and $d_1, d_2, d_3, d_4, d_5, d_6 \ldots$ are irregular magnetic field intensities which deteriorate uniformity of the magnetic field. When the magnet is arranged symmetric with respect to the center plane thereof, $d_1, d_3, d_5 \ldots$ among the above irregular magnetic field components become zero because of the symmetry nature.

Accordingly, only the irregular magnetic field components $d_2, d_4, d_6 \ldots$ are required to take into account as the irregular magnetic fields which deteriorate uniformity of the magnetic field.

An MRI use magnet is required to form a uniform magnetic field having a few ppm order variation in an image taking region near the magnet center portion. A uniform magnetic field generation is achieved by successively eliminating the irregular magnetic field components $d_2, d_4, d_6 \ldots$ from lower degree terms among developed terms according to equation (1) expressing a magnetic field in z direction near the center portion of the magnet. Form equation (1) it will be understood that if the irregular magnetic field components are eliminated up to high degree terms, a space of uniform magnetic field will be expanded.

A magnet device for an MRI device used such as in hospitals is required to generate a uniform magnetic field within ±5 ppm variation rate in a spherical region having a diameter of 40 cm~50 cm.

In order to fulfill the above requirement, proper magnet designs are usually employed so that the irregular magnetic field components from the second degree to 8th degree or 10th degree in that $d_2, d_4, d_6, d_8$ and $d_{10}$ become zero.

As has been explained above, in order to generate a uniform static magnetic field, at first it is necessary to make zero the second degree irregular magnetic field component $d_2$.

For the sake of simplicity, a magnetic field formed by an annular ring line current is discussed. Among developed terms expressed by the equation (1) of the magnetic field produced by the annular ring line current as shown in FIG. 13, plots of $d_2$ depending on $\beta=a/b$ are shown in FIG. 14. Wherein, a represents a radius of the annular ring line current, b represents a distance of the annular ring line current from the origin in z axis direction and i represents a current value, and in the plots it is assumed that b=1 and i=1. As will be apparent from FIG. 14, the developed term coefficient $d_2$ becomes zero when $\beta=2$, in other words, the second degree irregular magnetic field component becomes zero with the arrangement which is already known as a Helmholtz coil.

In an MRI device use magnet, it is necessary to eliminate at first the secondary degree irregular magnetic field component as has been explained above, however, as will be understood from FIG. 14, if coils through which currents in the same direction flow are only used, it is impossible to reduce the coil diameter than that of the Helmholz coil arrangement.

Accordingly, two annular ring currents each having $\beta$ smaller than 2 as shown in FIG. 15 are discussed. Wherein, it is assumed that a radius and current value of an annular ring current 175 are respectively $a_1$ and i=1, and a radius and current value of an annular ring current 176 are respectively $a_2$ and i=−0.4. Values of $d_2$ produced respectively by the two coils depending on $\beta$ are plotted in FIG. 16. Curves 177 and 178 respectively correspond to the annular ring currents 175 and 176. As will be apparent from FIG. 16, if the values $\beta_1$, and $\beta_2$ are properly selected, it is possible to make the absolute values of respective $d_2$ terms produced by the annular ring currents 175 and 176 equal, but the signs thereof to be opposite each other, thereby, the sum of irregular magnetic field components $d_2$ produced by the two annular ring currents 175 and 176 can be rendered zero. Namely, through an arrangement of a plurality of coils each having different polarity in alternative manner in radial direction the secondary degree irregular magnetic field component can be eliminated with coils having a smaller outer diameter than that of a Helmholz coil.

Now, an exemplary arrangement in which the secondary and quadratic degree irregular magnetic field components are eliminated will be explained. FIG. 21 shows an optimum designed coil arrangement which is determined through computer programs so as to minimized the sum of absolute values of magnetomotive force according to the present invention. As is illustrated in FIG. 21, in order to eliminate irregular magnetic field components up to the quadratic degree and to reduce the outer diameter of the coils than the arrangement of a Helmholz coil, total of six pieces of coils is necessary, in that three for one of two static magnetic field generation sources and other three for the other static magnetic field generation source. Coils of which current flow direction are positive and negative are alternatively arranged in the radial direction. The absolute values of magnetomotive force are increased according to the radial diameter size thereof.

How the secondary and quadratic degree irregular magnetic field components are eliminated in this coil arrangement will be explained with reference to FIGS. 22 and 23.

FIG. 22 shows secondary degree irregular magnetic field components produced by the respective coils shown in FIG. 21, and FIG. 23 shows quadratic degree irregular magnetic field components produced by the respective coils as shown in FIG. 21. Curves 211, 212 and 213 are sensitivity curves relating to secondary degree irregular magnetic field components corresponding to magnetomotive forces produced by coils #1, #2 and #3 in FIG. 21 with respect to $\beta$. Curves 214, 215 and 216 are sensitivity curves of the quadratic degree irregular magnetic field components corresponding to the magnetomotive forces of the coils #1, #2 and #3 as shown in FIG. 21 with respect to $\beta$. The values $\beta$ of geometric centers of the cross sections of the coils #1, #2 and #3 are respectively 0.30, 0.80 and 1.46. Accordingly, the secondary degree irregular magnetic field component produced by, for example, coil #3 assumes the value indicated by the numeral 203. Accordingly, with the coil arrangement of FIG. 21 the coils #1, #2 and #3 respectively produce the secondary degree irregular magnetic field components as indicated by numerals 201, 202 and 203 in FIG. 22, and the positions and magnetomotive forces of the respective coils are set so that the sum of these secondary degree irregular magnetic field components is rendered zero. Likely, the coils #1, #2 and #3 respectively produce the quadratic degree irregular magnetic field components as indicated by numerals 204, 205 and 206 in FIG. 23, and the positions and magnetomotive forces of the respective coils are set so that the sum of these quadratic degree irregular magnetic field components is rendered zero.

These relationships can be qualitatively explained as follows. As has been explained above, at first it is necessary to eliminate the secondary degree irregular magnetic field components, for this reason, the positions of coils #2 and #3 are mostly determined on this base. Although the coil #3 produces the quadratic degree irregular magnetic field component as indicated by the numeral 206 to be eliminated, however, as seen from the sensitivity curves in FIGS. 22 and 23, it will be understood that no solution which renders both the secondary and quadratic degree irregular magnetic field components zero can not exist, only when the positions and the magnetomotive forces of the coils #2 and #3 are varied. Accordingly, the coil #1 is newly added of which radius is the smallest and of which magnetomotive force is directed positive to produce the quadratic degree irregular magnetic field component indicated by the numeral 204, thereby, the total sum of quadratic degree irregular magnetic field components is reduced zero. Further, in order to minimize the sum of absolute values of magnetomotive forces, the positions of the respective coils are determined in such a manner that the positions corresponding near to the peaks of the respective sensitivity curves are avoided and the positions showing as much as small sensitivity are selected. Actually, since the coil #1 produces the secondary degree irregular magnetic field component as indicated by the numeral 201, it is necessary to adjust to render the secondary degree irregular magnetic field components zero as a whole as well as the quadratic degree irregular magnetic field components zero, accordingly an optimum arrangement of the coils is correctly determined through computer programs incorporating the sensitivity curves. In order to eliminate the secondary and quadratic degree irregular magnetic field components with group of coils each having a smaller radius than that of a Helmholz coil, it is necessary to arrange coils with positive and negative current flow directions alternatively as has been explained above, this is because the sensitivity curves of irregular magnetic field components of respective degrees show the shapes as illustrated in FIG. 19. The respective sensitivity curves are physically and inherently determined based on an electromagnetic phenomenon. The present invention is brought about on the analysis of the sensitivity curves, accordingly, the result of the present invention which is obtained by making use of the analysis is non-ambiguously determined.

Although in the present embodiment a specific explanation on elimination of the irregular magnetic field components of higher degree equal to and more than 6 degree is omitted, the same principle can be applied thereto, in that through the alternate arrangement of coils having different polarity in the radial direction thereof, a magnet of which irregular magnetic field components are eliminated up to high degrees and which generates an extremely uniform magnetic field can be constituted with a magnet having a smaller outer diameter than that of a Helmholz coil. Further, the present structure provides a minimum number of coils which eliminates the irregular magnetic field components up to necessary degree, accordingly, the sum of the absolute values of magnetomotive forces of the respective coils shows minimum among any conceivable coil arrangement.

The above coil arrangement can be determined through computer programs making use of the sensitivity curves of the irregular magnetic field intensities of respective degrees as shown in FIG. 19. Since it is difficult to explain the function thereof, the nature of the solution is qualitatively explained. FIG. 20 shows a general space distribution of sixth degree irregular magnetic field intensity. In the drawing, the origin represents the center of the magnet, z axis corresponds to the center axis of the magnet, ρ axis represents an axis in radial direction which passes through the center of the magnet and is directed to an arbitrary direction, and the abscissa represents sixth degree irregular magnetic field intensity. As will be understood from the equation (1) referred to previously, the intensity at the origin is zero and the intensity increases in proportion to 6th power of the distance according to the distance increase from the origin. However, depending on the nature of Pn(cos θ) the intensity is expressed by a space distribution having positive and negative values with respect to azimuth angle θ. Accordingly, for example, with regard to the space distribution of 6th degree irregular magnetic field component through alternative arrangement of coils having positive and negative polarity, the 6th degree irregular magnetic field component can be effectively canceled out. The alternative arrangement of coils having positive and negative polarity can be generalized in such a manner that when geometric centers of cross sections of respective coils are projected on a straight line passing through the origin, current polarity of the coils corresponding to the projected centers is aligned alternatively in positive and negative on the straight line as will be defined in claims.

Now, advantages of the present invention will be specifically explained by making use of numerical calculation result. FIG. 17 shows a calculation result based on the principle of the present invention and at the same time illustrates a coil arrangement and contours representing magnetic field uniformity. The respective contours of magnetic field uniformity indicate ±1, ±5 and ±10 ppm from the inside. Wherein, the current density in the coils is 100 A/mm$^2$, the interval between the upper and lower coils is 1.0 m and the outer diameter of the coils is limited to 1.7 m. Further, the intensity of the center magnetic field is 0.4 T and the second through 6th degree irregular magnetic field components are rendered zero near the center portion.

As will be apparent from FIG. 17, when the geometric centers of the respective coil cross sections on z-ρ plane in the first quadrant are projected on the ρ axis, the current flow directions at the projected centers corresponding to the respective coils are aligned alternatively in positive and negative. With the arrangement method according to the present invention the sum of absolute values of magnetomotive force by the respective coils is minimized, namely, the present method is understood the most reasonable one.

FIG. 18 shows one of calculation results not based on the principle of the present invention.

The current density in the coils, the intensity of the center magnetic field, and the degrees of canceled out irregular magnetic field components are substantially the same as these of FIG. 17. In the calculation example in FIG. 18, when the geometrical centers of the respective coil cross sections on z-ρ plane are projected on any straight lines on the z-ρ plane passing the origin, their current flow directions at the projected centers corresponding to the respective coils are never aligned alternatively in positive and negative, namely, FIG. 1B arrangement never follows the principle of the present invention. When comparing the calculation example of FIG. 18 with the calculation example of FIG. 17, their space distributions of generated magnetic field are substantially the same, however, in FIG. 18 calculation example requires 1.4 times of the sum of absolute values of magnetomotive force produced by the coils for achieving the same space magnetic field distribution and further requires two more coils in total. Namely, the most advantageous effect of the present invention is to provide a coil arrangement which shows the minimum sum of absolute value of magnetomotive force among possible coil arrangements which produce a magnetic field distribution having a predetermined space distribution. In the coil arrangement as shown in FIG. 18 which does not follow the principle of the present invention, since the sum of absolute values of magnetomotive force of the coils is 1.4 times larger when compared with the coil arrangement as shown in FIG. 17 which follows the principle of the present invention and the number of coils also increases by 2, a variety of demerits are caused such as an increase of electromagnetic force between coils, complexing of support structure and weight increase thereby and weight increase of cooling means, and as a result, production cost of the magnet extremely increases, therefore, it is understood that the conventional design method as exemplified in FIG. 18 is very inefficient one. Further, in the calculation result as shown in FIG. 17 which is based on the principle of the present invention, the absolute value of magnetomotive force of a coil having the largest average radius is larger than the absolute values of magnetomotive force of other coils and it is further understood that when the respective coils in the first quadrant is projected on ρ axis, the absolute values of magnetomotive force of the respective coils are aligned according to the magnitudes thereof. These setting methods of the magnetomotive forces are also conditions which minimizes the sum of absolute values of magnetomotive force of the entire coils.

Further, a magnet device for an open type MRI device as disclosed in U.S. Pat. No. 5,410,287 is directed to a horizontal magnetic field type, however, the coil arrangement therein is somewhat similar to that explained in connection with FIG. 18.

Further, for a whole-body MRI it is necessary to generate a uniform static magnetic field having variation within ±5 ppm in a spherical region having a diameter of 40 cm~50 cm. For this requirement it is necessary to make zero at least up to 8th degree irregular magnetic field components, and for the purpose of design freedom at least four coils are necessary for each magnet assembly. In a coil design which eliminates irregular magnetic field components up to 6th degree, 8th degree irregular magnetic field component dominantly controls the magnetic field uniformity, therefore, it is necessary to reduce the intensity of the 8th irregular magnetic field as much possible, and for this necessary it is preferable to limit the magnetomotive force produced by the respective coils. Although not illustrated as calculation examples here, similar calculation as in FIG. 17 and FIG. 18 examples can be performed for the case of three coils, and it is confirmed that if the three coils are arranged in the radial direction so that the current flow directions therein align alternatively in positive and negative, the sum of absolute values of the coil magnetomotive force is minimized.

Because of size limitation of such as a cryostat and a low temperature vessel, necessary number of coils can not sometimes be disposed in the radial direction, in such instance, it is sufficient if a coil is disposed along the inner wall of the low temperature vessel. The present invention discloses such generalized coil arrangement methods, and the specific examples thereof will be explained as embodiments hereinbelow.

BRIEF DESCRIPTION OF THE DRAWINGS

FIG. 7 is a cross sectional view of a super conducting magnet representing a still further embodiment according to the present invention;

FIG. 8 is a cross sectional view of a super conducting magnet representing a still further embodiment according to the present invention;

BEST MODES FOR CARRYING OUT THE PRESENT INVENTION

Hereinbelow, embodiments of the present invention will be explained specifically with reference to FIG. 1 through FIG. 12.

Figure 1:
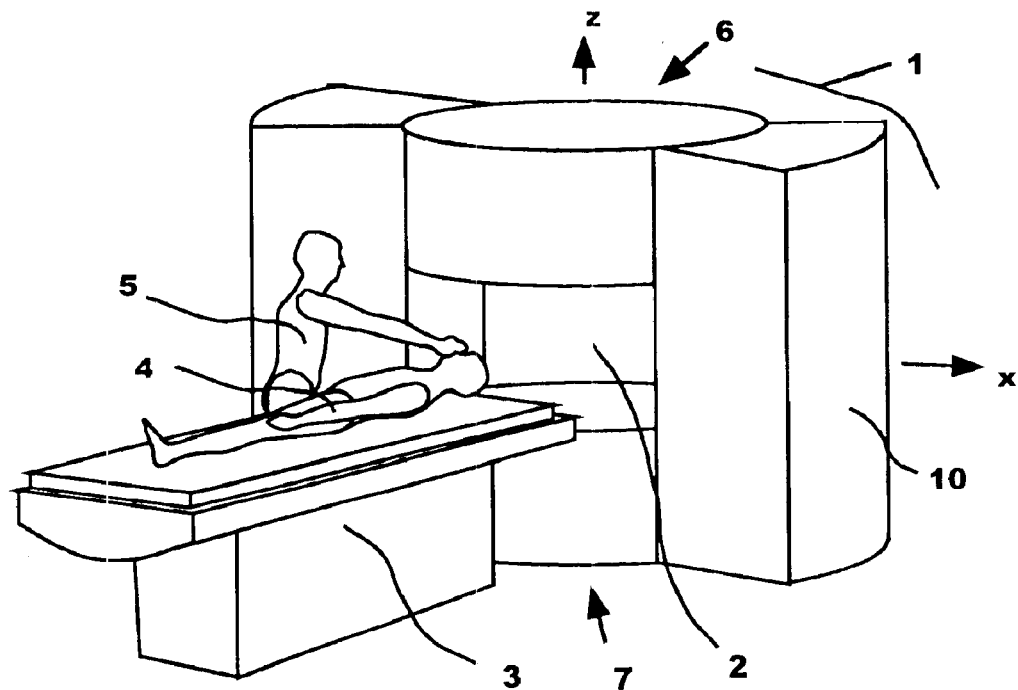
FIG. 1 is a perspective view of an open type MRI device using a super conducting magnet according to the present invention.
Figure 2:
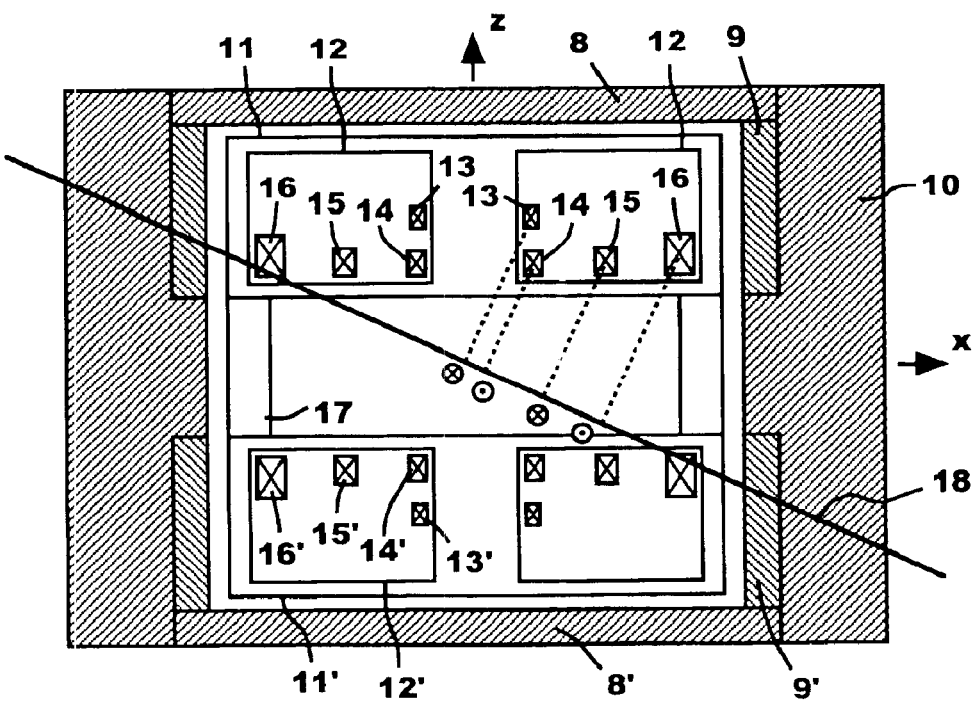
FIG. 2 is a cross sectional view of a super conducting magnet representing an embodiment according to the present invention.

FIG. 1 is a perspective view of an open type super conducting MRI device using a super conducting magnet representing an embodiment according to the present invention. FIG. 2 is a cross sectional view on z-x plane of the super conducting magnet 1 among many constituting elements of the open type MRI device in FIG. 1.

The MRI device as shown in FIG. 1 produces a uniform magnetic field in z axis direction in an open region 2 by upper and lower super conduction magnet assemblies 6 and 7, and permits MRI image taking at the center portion of the open region 2. A patient 4 is carried by a bed and movable table 3 so that an image taking portion of the patient 4 positions at the center portion of the open region 2. The upper and lower super conducting magnetic assemblies 6 and 7 are magnetically coupled by column shaped external ferromagnetic bodies 10 and are further designed so as to suppress leakage magnetic field. With thus structured MRI, claustrophobia to which the patient 4 tends to be subjected during image taking is extremely reduced and the patient 4 can even be given an open space feeling, thereby, a psychological pressure of the patient 4 with respect to the image taking is greatly reduced. Further, an access of a medical doctor or an inspection engineer 5 to the patient 4 during the image taking can be facilitated significantly. In particular, an access of the medical doctor or the inspection engineer 5 to an object portion of the patient 4 during the image taking is permitted, therefore, an Interventional Radiology (IVR) is enabled which broadens possibility of medical treatment.

Further, as an advantage of the MRI device having the structure as shown in FIG. 1, since the direction of static magnetic field is orthogonal with respect to the longitudinal direction of a human body, a solenoid coil can be used for a probe for receiving NMR signals. The sensitivity of such solenoid type probe is theoretically 1.4 times higher than that of a saddle shaped or bird cage shaped probe used for the horizontal magnetic field type MRI device.

Accordingly, when assuming that the center magnetic field intensity is equal each other, the vertical magnetic field type MRI having, the structure as shown in FIG. 1 can take a further accurate tomographic images with a further higher speed in comparison with the conventional horizontal magnetic field type MRI device.

As has been mentioned above, the MRI device structured according to the concept as shown in FIG. 1 has a variety of advantages, however, a key for achieving a highly open space feeling from structural point of view is how to reduce the diameter of the upper and lower magnetic assemblies 6 and 7. The present invention exactly relates to the key and provides a magnet assembly structure of which outer diameter is small and of which production cost is inexpensive, and moreover which generates a desired uniform magnetic field.

Now, the structure of the magnet assemblies 6 and 7 will be explained with reference to FIG. 2. The upper and lower magnet assemblies 6 and 7 are surrounded at the outer circumferences thereof by respective ferromagnetic bodies so as to suppress leakage magnetic field. More specifically, disk shaped external ferromagnetic bodies 8 and 8' and cylindrical external ferromagnetic bodies 9 and 9' surround around upper and lower vacuum vessels 11 and 11', and the upper and lower ferromagnetic bodies 8, 8' and 9, 9' are magnetically coupled by the column shaped external ferromagnetic bodies 10. As the external ferromagnetic bodies used in the present embodiment, any material will do, if such shows ferromagnetic property so that a variety of material can be used, however, in view of magnetic properties, cost and mechanical strength ion is generally preferable. Further, when a weight lightening of the ferromagnetic bodies is required, a material having a high permeability can be used. Through the surrounding of the circumferences with the external ferromagnetic bodies magnetic passages are formed for magnetic fluxes possibly leaking outside from the device to thereby suppress the leakage magnetic field from expanding far.

Main super conducting coils 13, 13', 14, 14', 15, 15' and 16, 16' are disposed substantially symmetric in upper and lower positions while sandwiching a uniform magnetic field region at the center of the magnet and substantially concentrically with respect to z axis, and produces a uniform magnetic field in vertical direction, namely in z axis direction. The upper and lower super conducting coils are disposed inside respective cooling containers 12 and 12', and the upper and lower cooling containers 12 and 12' are accommodated in respective vacuum vessels 11 and 11'. Further, for the sake of simplicity although the illustration in FIG. 2 is omitted, there is a structure for supporting the super conducting coils and further there is provided a heat shielding member between the vacuum vessels and the cooling containers for preventing penetration of radiation heat. Liquid helium is stored inside the cooling vessels and cools the super conducting coils to a super low temperature of 4.2° K.

The upper and lower vacuum vessels are held by coupling tubes 17 disposed therebetween while keeping a predetermined distance. These coupling tubes 17 work to support mechanically the upper and lower vacuum vessels 11 and 11', however, can include a function of thermally connecting the upper and lower cooling containers. If such function is added, it becomes unnecessary to provide each one cryostat for upper and lower cooling containers, thereby, the system can be operated with a single cryostat. Further, the number of the coupling tubes 17 and the column shaped ferromagnetic bodies 10 needs not to be limited to two as illustrated, but can be increased three, four and more. Further, in order to obtain a further open space feeling a single support column forming an overhang structure can be used.

In the present embodiment, the respective four main super conducting coils 13, 13', 14, 14', 15, 15' and 16, 16' inside the respective upper and lower magnet assemblies are arranged so as to align their polarities alternatively in positive and negative. More precisely, when assuming a certain straight line 18 passing through the center of the magnet assemblies on any plane containing z axis representing the center axis of the magnet (herein, for the sake of explanation simplicity z-x plane is assumed) and when the geometric center of the cross sections of the respective super conducting coils in the first quadrant on the z-x plane are projected on the straight line 18, the polarities of current flow of the projections on the straight line 18 corresponding to the respective coils align alternatively in positive and negative. In other words, in the coil 16 a current is flown to the direction causing the main magnetic field and of which direction is assumed as the positive direction, a current in the negative direction is flown in the coils 13 and 15, and a current in positive direction is flown in the coil 14.

Further, as seen from the drawing, the magnitude of absolute values of magnetomotive force of the respective coils 16, 15, 14 and 13 is larger in this appearing order and it is understood that when the respective coils in the first quadrant on the z-x plane are projected on the straight line 18, the absolute values of magnetomotive force of the respective coils align in their order of magnitude. Further, the absolute value of magnetomotive force of the coil 16 having the maximum average radius is the largest. These magnetomotive force setting method is also one of the conditions which minimizes the sum of absolute values of magnetomotive force of the entire coils.

The positions and magnetomotive forces of the respective coils are designed based on calculations so as to form a uniform magnetic field distribution. Although arrangement of coils which produces a uniform magnetic field is infinite, however, the above arrangement method as has been explained in the Summary of the Invention gives the minimum sum of absolute values of magnetomotive force, thereby, the magnet can be produced with minimum cost. Further, since the sum of absolute values of magnetomotive force is small, the cross sectional areas of the respective coils are reduced, thereby, the diameters of the magnet assemblies can also be reduced. Still further, the present embodiment is designed to render the irregular magnetic field components from second degree to 8th degree zero, and for this purpose four coils are disposed in respective magnet assemblies. As a result, a uniform magnetic field of 45 cm dsv (diameter of spherical volume) with ±4 ppm variation is obtained at the center of the magnet which sufficiently fulfills the specification for a whole-body MRI.

Hereinbelow, other embodiments according to the present invention will be explained with reference to the drawings.

Figure 3:
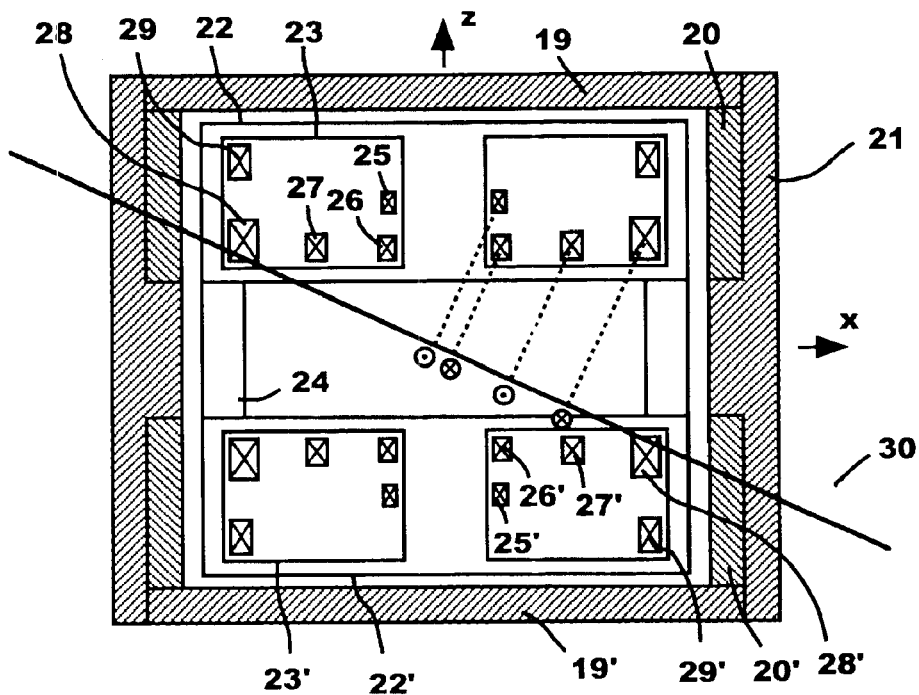
FIG. 3 is a cross sectional view of a super conducting magnet representing another embodiment according to the present invention.

FIG. 3 is a cross sectional view of a super conducting magnet for an open type MRI representing another embodiment according to the present invention. The constitutional structure of the present embodiment is substantially the same as the super conducting magnet as shown in FIGS. 1 and 2 except for a provision of super conducting shielding coils 29 and 29' for reducing the weight of the external ferromagnetic bodies suppressing leakage magnetic field. According to general naming of leakage magnetic field shielding methods, the method of FIG. 2 embodiment is called as a passive shielding method and the method of FIG. 3 embodiment is called as a hybrid shielding method. When the geometric centers of the cross sections of main super conducting coils 25, 25', 26, 26', 27, 27' and 28, 28' except for the super conducting shielding coils 29 and 29' in FIG. 3 on the z-x plane in the first quadrant are projected on a straight line 30 (an imaginary line), the coils are arranged in such a manner that the current flow direction of the corresponding coils to the projections aligns alternatively in positive and negative on the straight line 30.

Figure 4:
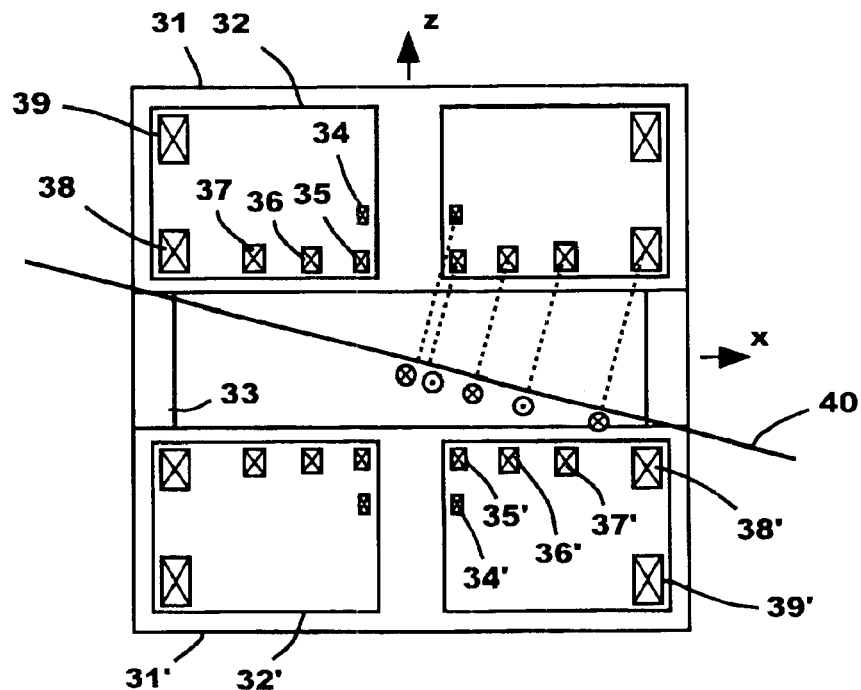
FIG. 4 is a cross sectional view of a super conducting magnet representing still another embodiment according to the present invention.

FIG. 4 is a cross sectional view of a super conducting magnet for an open type MRI device representing still another embodiment according to the present invention. The present embodiment shows an active shielding type super conducting magnet. The present embodiment suppresses leakage magnetic field only by the shielding coils and eliminates ferromagnetic shielding bodies such as iron, therefore, the weight thereof is minimized. When the geometric centers of the cross sections of main super conducting coils 34, 34', 35, 35', 36, 36' and 37, 37' except for the super conducting shielding coils 39 and 39' in FIG. 4 on the z-x plane in the first quadrant are projected on a straight line 40, the coils are arranged in such a manner that the current flow direction of the corresponding coils to the projections aligns alternatively in positive and negative on the straight line 40.

In the above embodiment, the magnet assemblies are constituted basically to produce a uniform magnetic field by air-core coils and to suppress leakage magnetic field by the external ferromagnetic bodies or the shielding coils. Hereinbelow,. embodiments according to the present invention which positively makes use of ferromagnetic bodies functioning as magnetic poles for producing the uniform magnetic field are disclosed. FIGS. 5 through 12 are cross sectional views of super conducting magnets for an open type MRI representing further embodiments according to the present invention.

Figure 5:
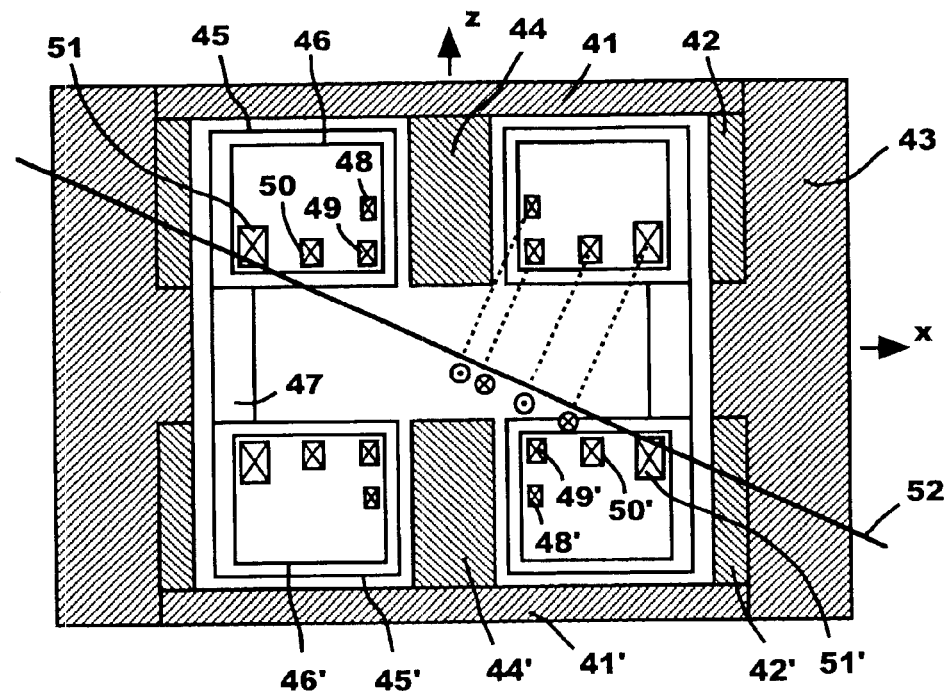
FIG. 5 is a cross sectional view of a super conducting magnet representing a further embodiment according to the present invention.

The magnet as shown in FIG. 5 is designed in such a manner that magnetic pole shaped ferromagnetic bodies 44 and 44' disposed inside disk shaped external ferromagnetic bodies 41 and 41' function to enhance the center magnetic field intensity and to reduce the share to be borne by the super conducting coils for the center magnetic field intensity as well as to reduce the sum of absolute values of magnetomotive force of the super conducting coils. Since the uniformity of magnetic field is primarily achieved by the arrangement of the super conducting coils and the division manner of their magnetomotive forces, the present arrangement is based on the principle of the present invention. Namely, where the geometric centers of the cross sections of main super conducting coils 48, 48', 49, 49', 50, 50' and 51, 51' in FIG. 5 on the z-x plane in the first quadrant are projected on a straight line 52, the coils are arranged in such a manner that the current flow direction of the corresponding coils to the projections aligns alternatively in positive and negative on the straight line 52.

Figure 6:
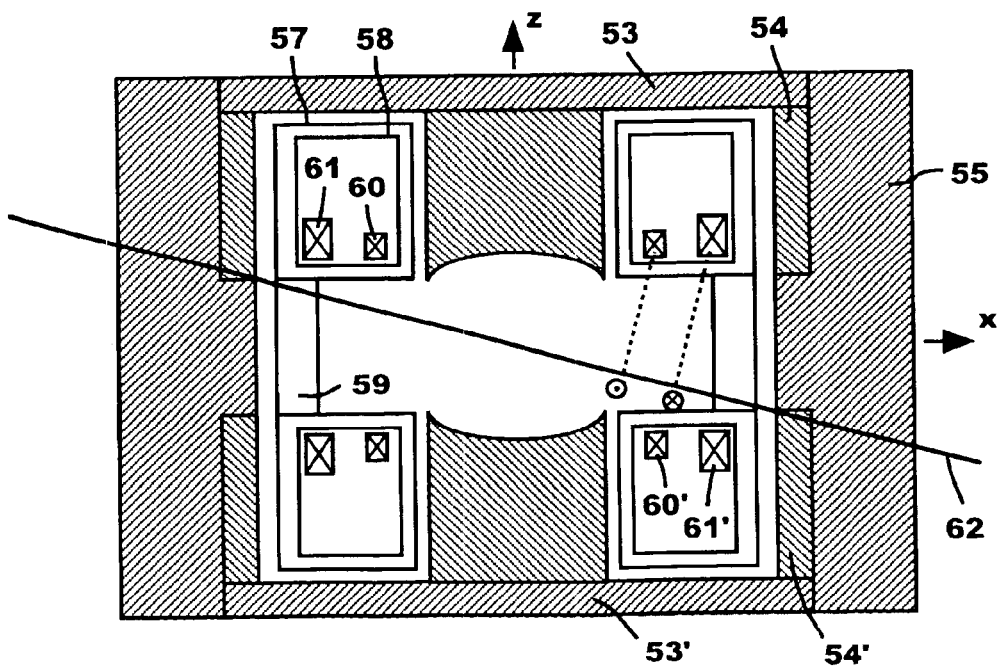
FIG. 6 is a cross sectional view of a super conducting magnet representing a still further embodiment according to the present invention.

In the magnet as shown in FIG. 6, the magnetic poles are further enlarged in comparison with the magnet as shown in FIG. 5 and the burden with regard to magnetomotive forces of super conducting coils is further reduced. The present embodiment is constituted to optimize the shape of the magnetic poles and to produce a certain level of uniform magnetic field only with the magnetic poles. Accordingly, a small number of super conducting coils will do and in the present embodiment each two super conducting coils in respective upper and lower magnet assemblies can produce sufficient uniform magnetic field. As has been explained in the Summary of the Invention, the current flow direction of the two super conducting coils 60, 60' and 61, 61' are opposite each other, thereby, the second degree irregular magnetic field components are eliminated with the small magnet assemblies. Namely, a current is flown in the outside super conducting coils in the direction producing the main magnetic field. On the other hand, a current in the opposite direction is flown in the inside super conducting coils.

In the magnet as shown in FIG. 7, a rough uniform magnetic field is produced by the magnetic poles having an optimized configuration and three super conducting coils are disposed in the respective magnet assemblies so as to further enhance the uniformity of the magnetic field. The main super conducting coils 70, 70', 71, 71' and 72, 72' are arranged so as to produce a uniform magnetic field with a limited radius and with a minimum magnetomotive force in such a manner that the current flow direction of the corresponding coils to the projections aligns alternatively in positive and negative on the straight line 73 as shown in FIG. 7 according to the principle of the present invention.

A magnet as shown in FIG. 8 is substantially the same as the magnet as shown in FIG. 7 except for the provision of super conducting shielding coils 84 and 84' for reducing the weight of the external ferromagnetic bodies for suppressing leakage magnetic field. In the present embodiment, the main super conducting coils 81, 81', 82, 82' and 83, 83' except for the shielding coils 84 and 84' are arranged so as to produce a uniform magnetic field with a limited radius and with a minimum magnetomotive force in such a manner that the current flow direction of the corresponding coils to the projections aligns alternatively in positive and negative on the straight line 85 as shown in FIG. 8 according to the principle of the present invention.

Figure 9:
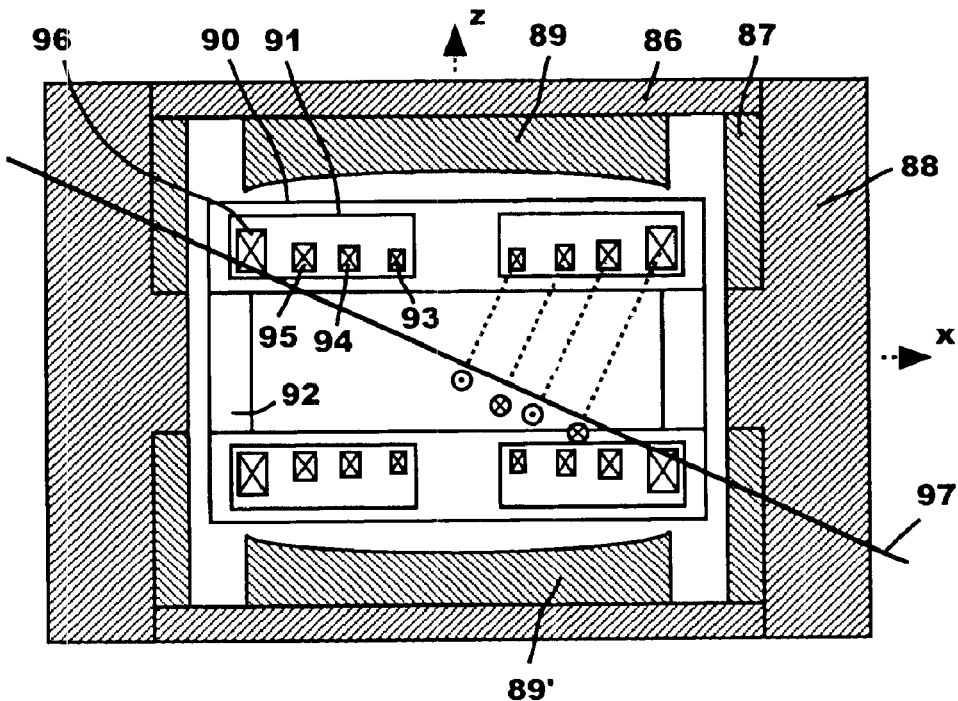
FIG. 9 is a cross sectional view of a super conducting magnet representing a still further embodiment according to the present invention.
Figure 10:
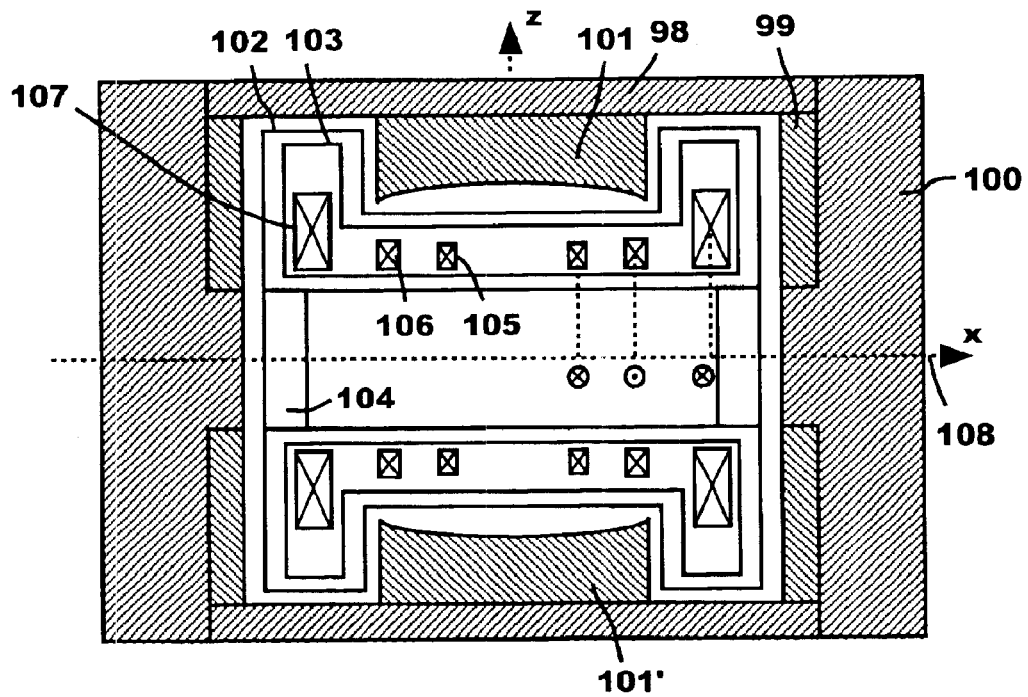
FIG. 10 is a cross sectional view of a super conducting magnet representing a still further embodiment according to the present invention.

FIGS. 9 and 10 are other embodiments of super conducting magnets for an open type MRI which produce a uniform magnetic field through combinations of magnetic poles and super conducting coils. The both magnets are principally constituted based on the following concept that the magnetic poles functions to strengthen the center magnetic field intensity so as to save magnetomotive forces of the coils and the uniformity of the magnetic field is achieved by the arrangement of the coils. Although the configuration of magnetic pole shaped ferromagnetic bodies 89, 89' and, 101, 101' is optimized, since the bodies are located away from the center portion of the magnet serving as the image taking region, it is impossible to produce the uniform magnetic field only with modification of the magnetic pole configuration. Therefore, in FIGS. 9 and 10 embodiments, with four and three super conducting coils for each assembly a uniform magnetic field is produced. Further, in FIG. 10 embodiment, the outer circumferential portions of vacuum vessels 102 and low temperature containers 103 are expanded so as to receive the end portion coils 107 having a larger magnetomotive forces. Further, with such configuration, the magnetic pole shaped ferromagnetic bodies 101 and 101' can be located near to the image taking region, thereby the share borne by the magnetic poles for strengthening the center magnetic field intensity can be increased, thus the magnetomotive force to be borne by the super conducting coils is saved. The main super conducting coils in both embodiments are arranged so as to produce a uniform magnetic field with a limited radius and with a minimum magnetomotive force in such a manner that the current flow direction of the corresponding coils to the projections aligns alternatively in positive and negative on the straight line 97 or x axis 108 as shown in FIG. 9 or 10 according to the principle of the present invention.

Figure 11:
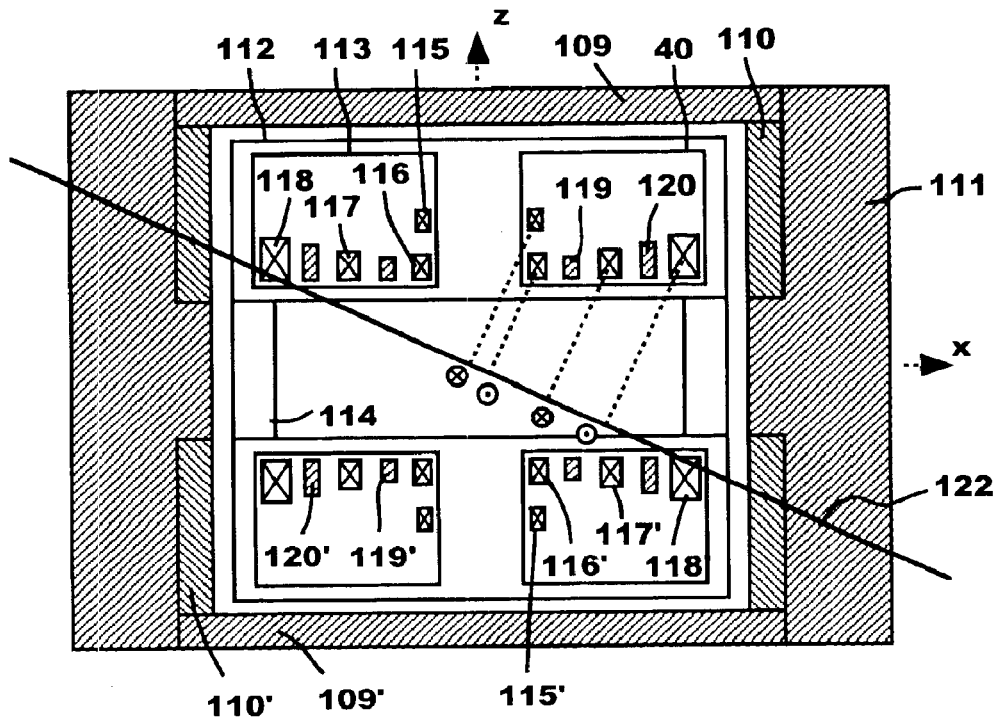
FIG. 11 is a cross sectional view of a super conducting magnet representing a still further embodiment according to the present invention.
Figure 12:
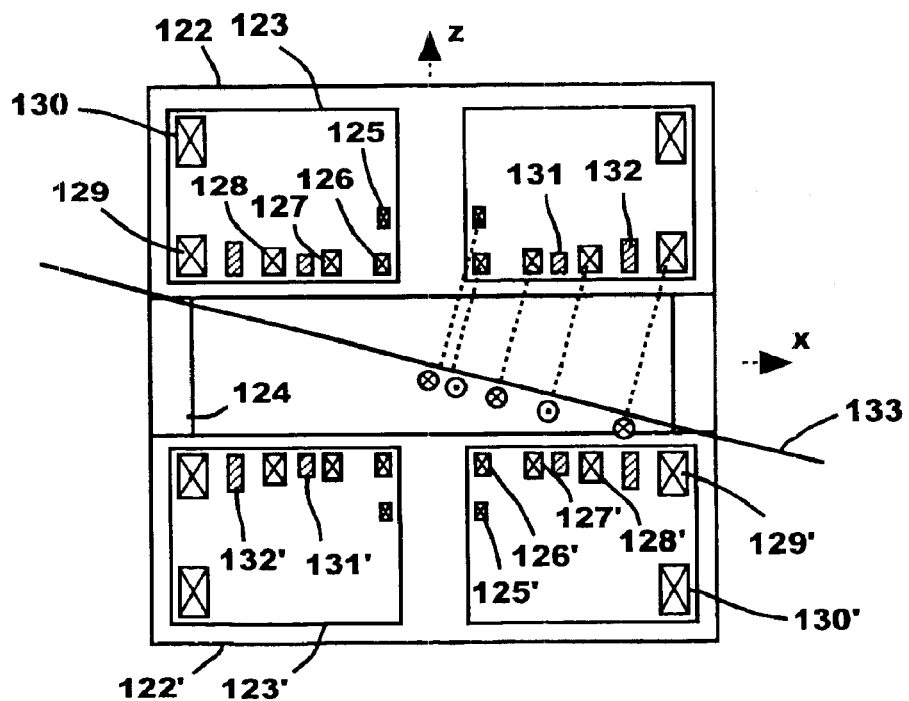
FIG. 12 is a cross sectional view of a super conducting magnet representing a still further embodiment according to the present invention.
Figure 13:
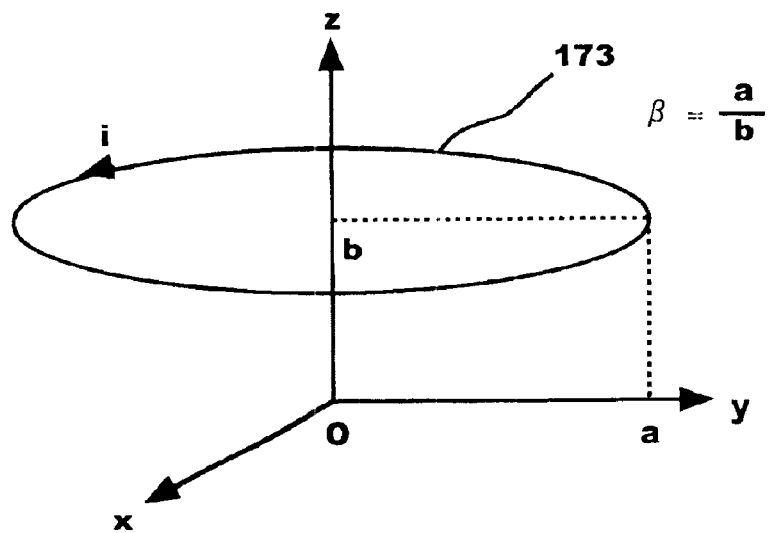
FIG. 13 is a view for explaining an annular ring current.
Figure 14:
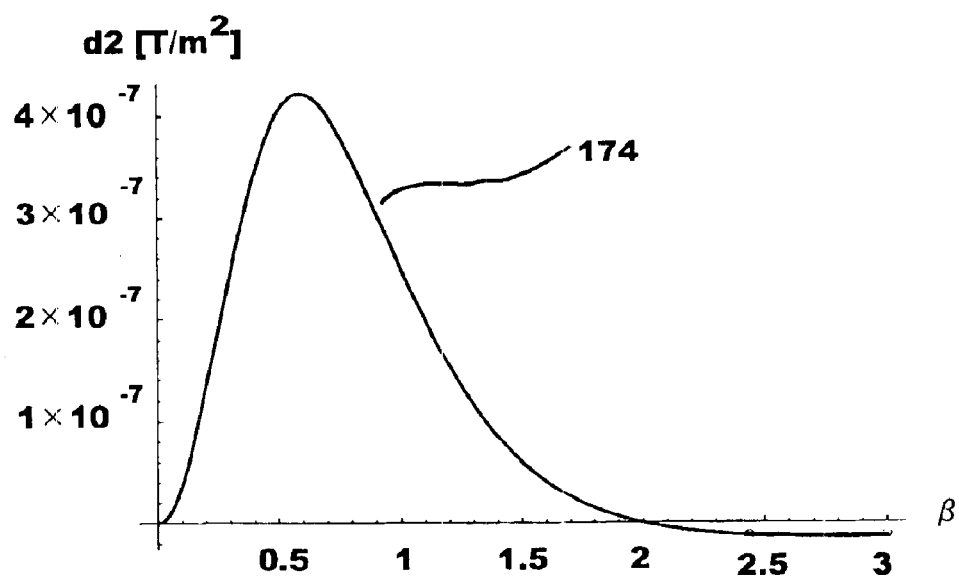
FIG. 14 is a diagram showing a sensitivity curve of secondary degree irregular magnetic field intensity produced by the annular ring current as shown in FIG. 13.
Figure 15:
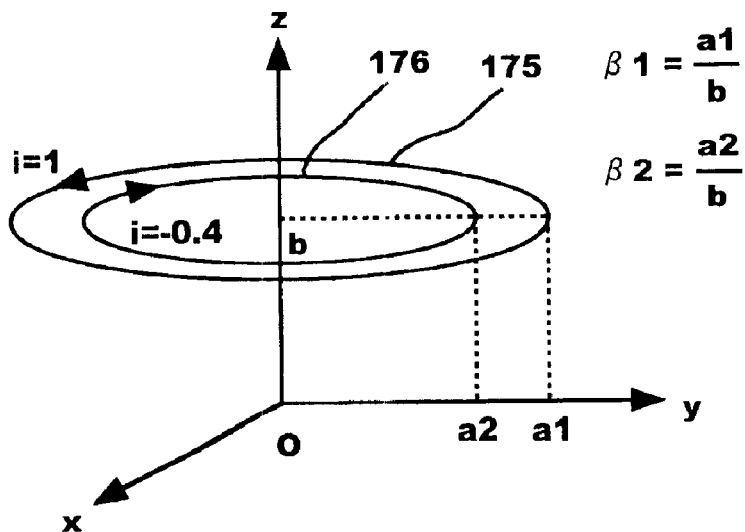
FIG. 15 is a view for explaining two annular ring currents.
Figure 16:
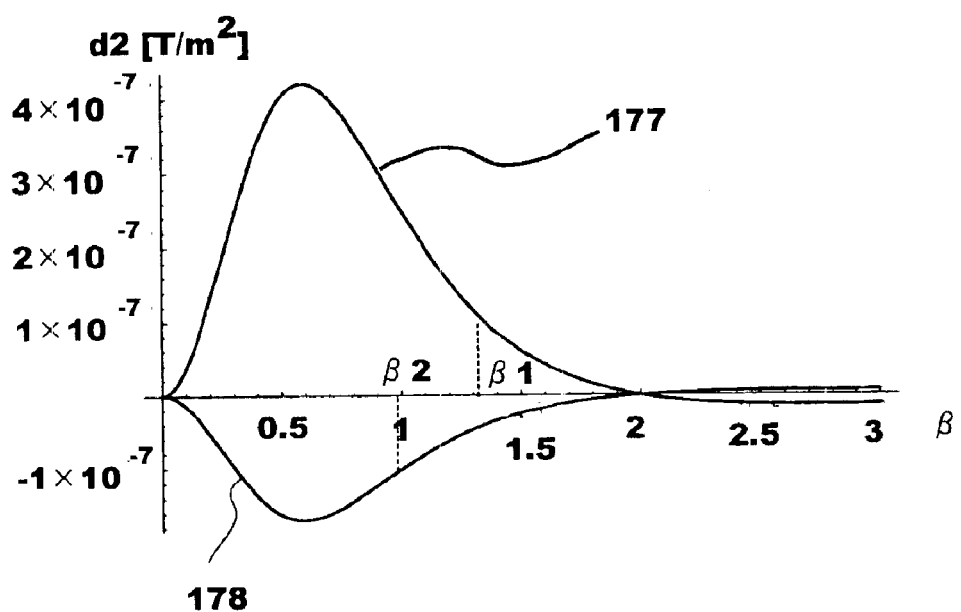
FIG. 16 is a diagram showing sensitivity curves of second degree irregular magnetic field intensity produced by the two annular ring currents as shown in FIG. 15.
Figure 17:
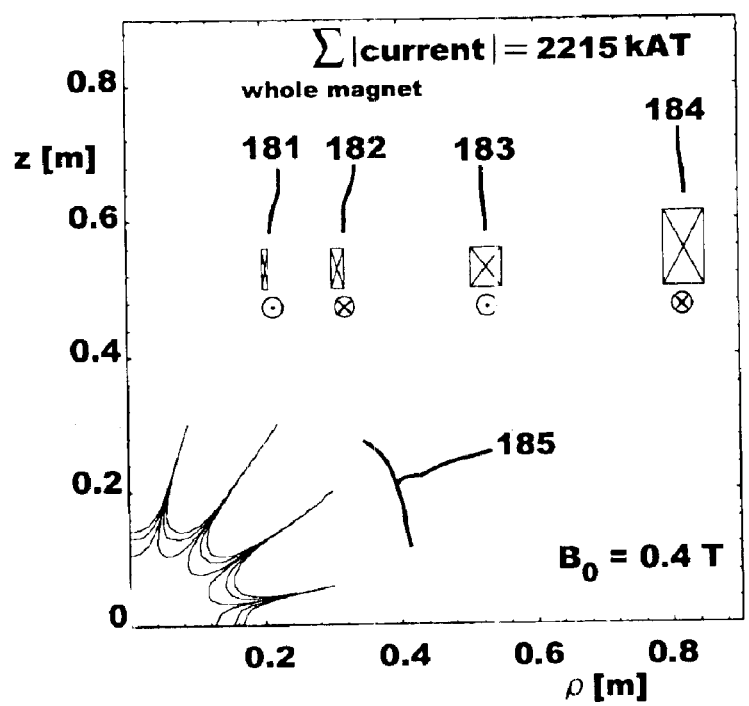
FIG. 17 is a diagram showing a numerical calculation example of a coil arrangement according to the present invention and contours of the magnetic field uniformity produced thereby.
Figure 18:
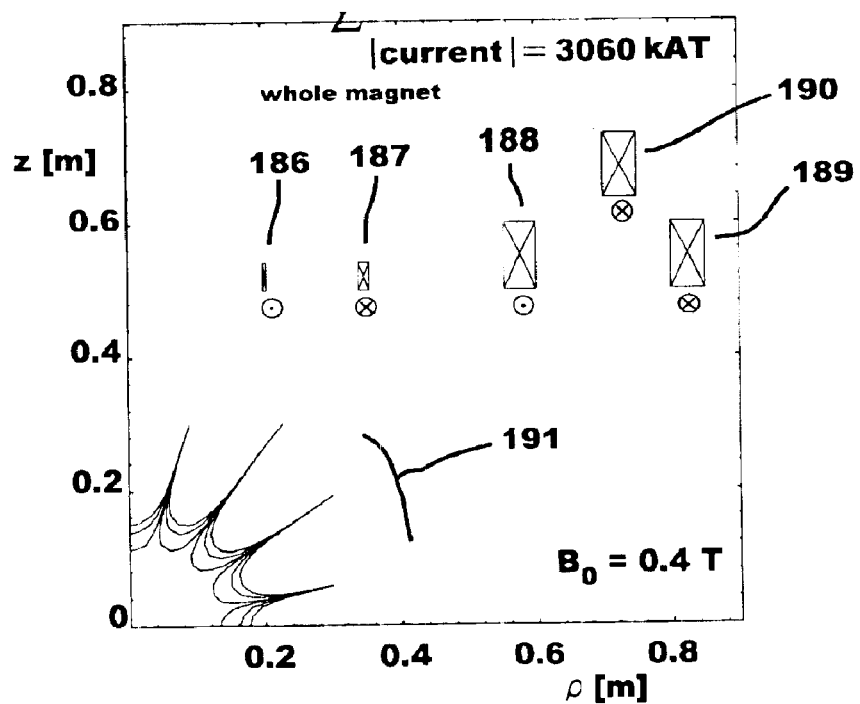
FIG. 18 is a diagram showing a numerical calculation example of a coil arrangement according to the present invention and contours of the magnetic field uniformity produced thereby.
Figure 19:
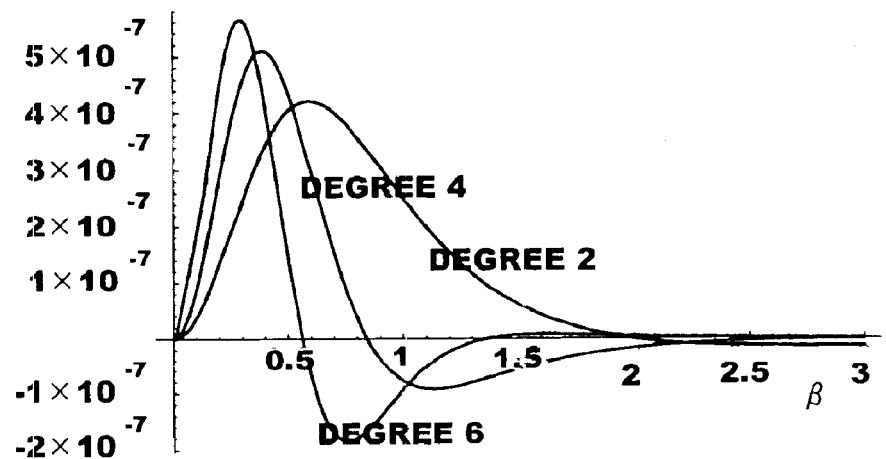
FIG. 19 is a diagram showing sensitivity curves of irregular magnetic field intensities from second degree to 6th degree produced by the annular ring current as shown in FIG. 13.
Figure 20:
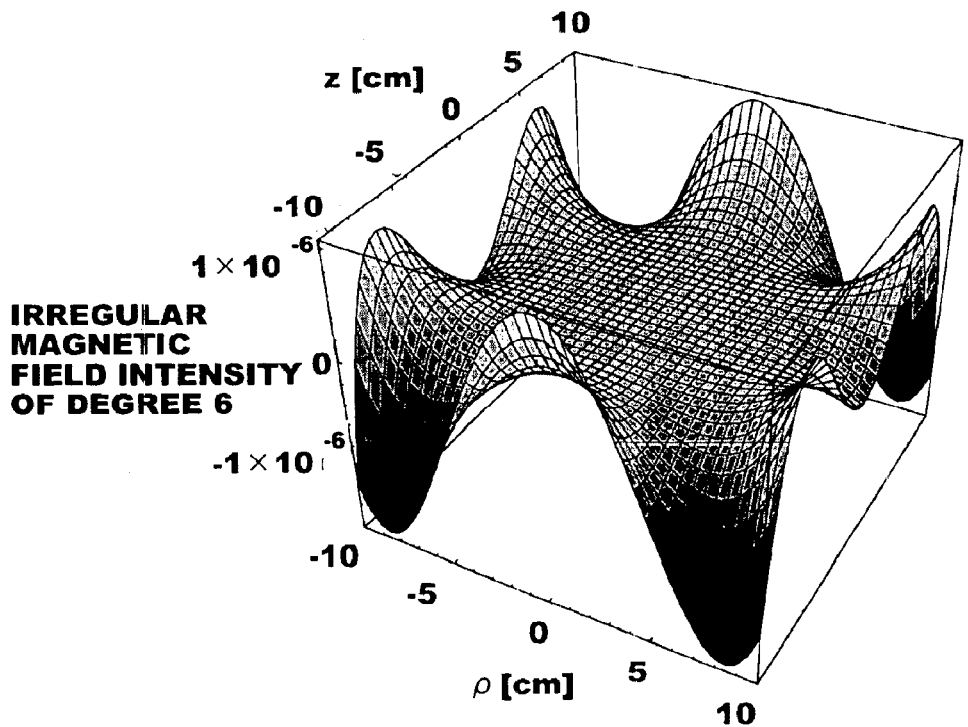
FIG. 20 is three dimensional plots showing a space distribution of 6th degree irregular magnetic field component.
Figure 21:
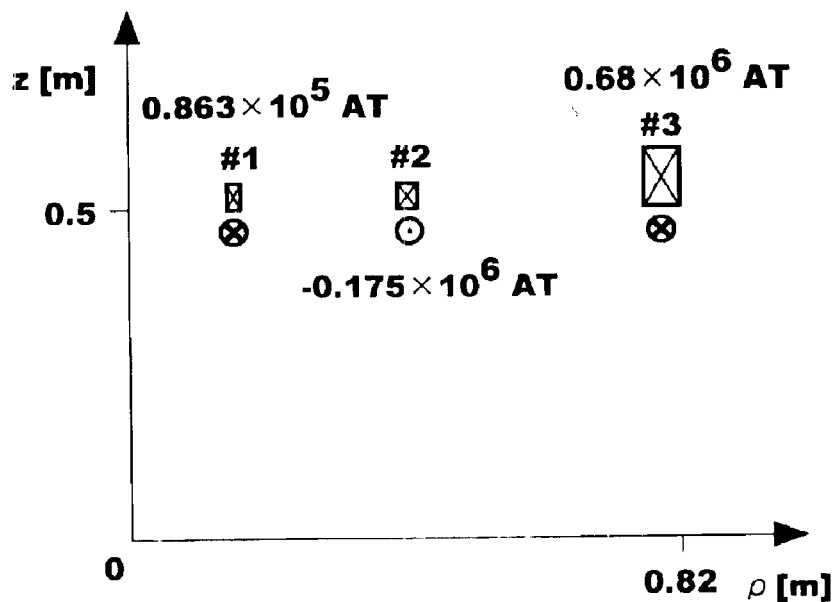
FIG. 21 shows an optimum designed coil arrangement through computer programs so that the sum of absolute values of magnetomotive force is minimized according to the principle of the present invention.
Figure 22:
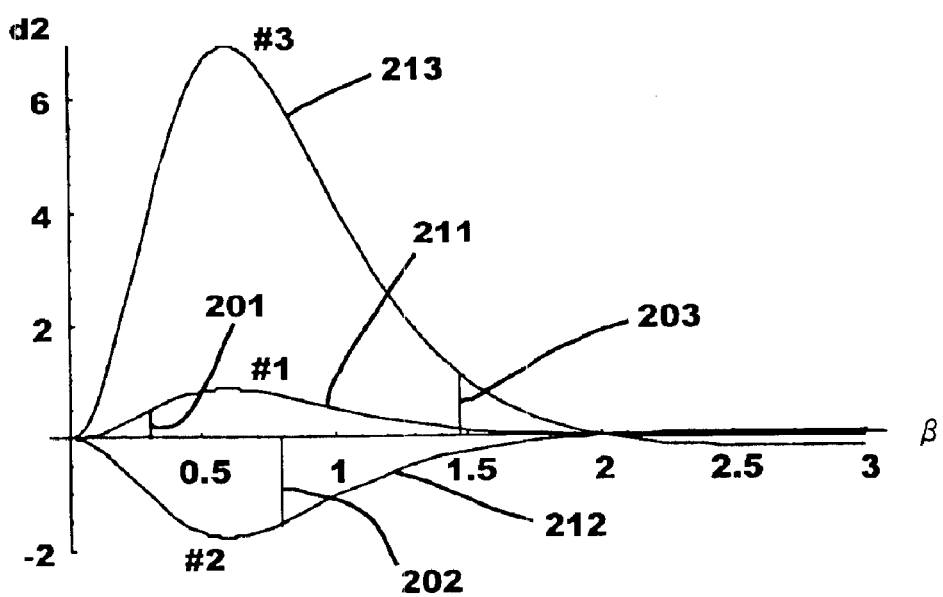
FIG. 22 shows second degree irregular magnetic field components produced by the respective coils as shown in FIG. 21.
Figure 23:
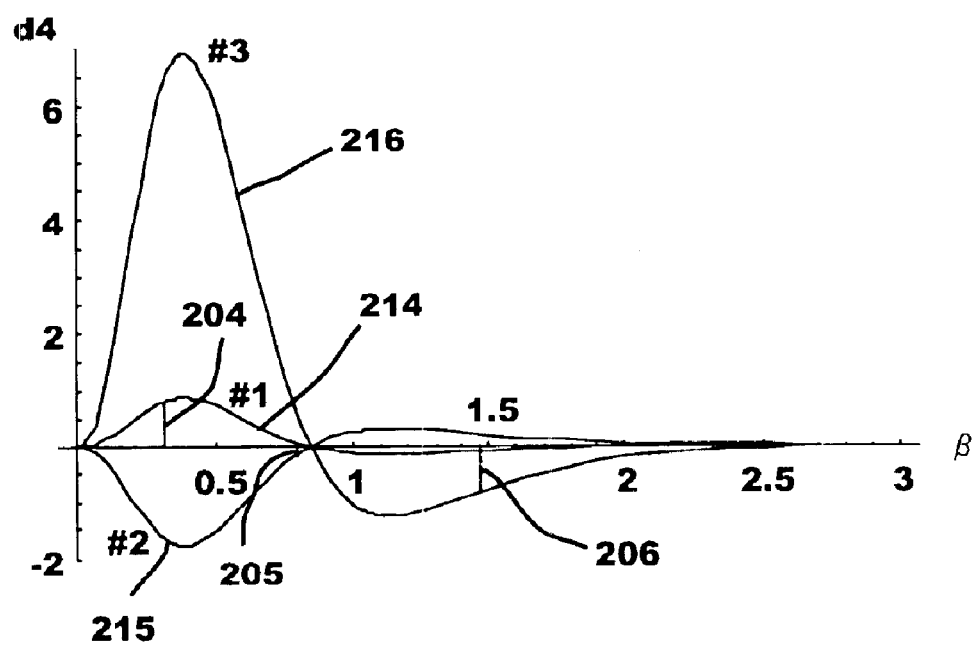
FIG. 23 shows 4th degree irregular magnetic field components produced by the respective coils as shown in FIG. 21.

FIGS. 11 and 12 show further embodiments in which ferromagnetic body elements are disposed inside the low temperature containers primarily for reducing the magnetomotive forces to be induced by the coils. With regard to leakage magnetic field suppressing method, FIG. 11 embodiment uses a passive shielding method and FIG. 12 embodiment uses an active shielding method. Inner ferromagnetic bodies 119, 119', 120, 120' and 131, 131', 132, 132' are formed in an annular ring shape and are disposed respectively between super conducting coils. When disposing these ferromagnetic body elements in such position, the magnetomotive forces to be induced by the coils can be effectively reduced. Likely, in the present embodiments, the super conducting coils constituting the main coils are arranged so as to produce a uniform magnetic field with a limited radius and with a minimum magnetomotive force in such a manner that the current flow direction of the corresponding coils to the projections aligns alternatively in positive and negative on the straight line 122 or 133 as shown in FIG. 11 or 12 according to the principle of the present invention.

Hitherto, the present invention has been explained with reference to the concrete embodiments. In the above embodiments, all of the coils were super conducting coils, however, the coils according to the present invention are not limited to the super conducting coils. For example, coils using copper wires can be used, further, any materials which carry current can be acceptable. For the present invention a variety of embodiments can be conceived a part of which has been explained above, therefore, the present invention should never be limited to the specific embodiments disclosed.

As has been explained hitherto, according to the present invention, a super conducting magnet, device for an open type MRI which is provided with a broad opening and is obtainable a broad uniform magnetic field production region with a high magnetic field intensity and with less leakage magnetic field and being stable in time, is further improved which provides a further higher open space feeling and permits a desirable access to a patient representing an inspection object through reducing the diameter of the magnet which also permits manufacturing cost reduction.

Further, according to the present invention, an MRI device can be realized which provides a higher open feeling and permits a desirable access to an inspection object.

INDUSTRIAL FEASIBILITY

As has been explained above, the magnet device according to the present invention is useful for a magnet device for a medical treatment use MRI device, in particular applicable for a super conducting magnet device for an open and vertical magnetic field type MRI device.

What is claimed is:

1. A magnet device in which two sets of static magnetic field generation sources, each being constituted by current carrying means disposed substantially concentrically with respect to a first direction in order to generate a uniform magnetic field directing in the first direction in a finite region, are disposed facing each other while placing the uniform magnetic field region therebetween and each of the static magnetic field generation sources is provided with at least four current carrying means, characterized in that when assuming a crossing point of a first axis which is in parallel with the first direction and passes substantially the center of the current carrying means and a second axis which crosses the first axis orthogonally and locates at substantially the equal distance from the two sets of the static magnetic field generation sources as a first point and further assuming a first straight line contained on a first plane defined by the first axis, the second axis and the first point and passing through the first point, the current carrying means are disposed in such a manner that, when geometrical centers of cross sections of the current carrying means on the first plane are projected on the first straight line, the current carrying direction of the current carrying means at the respective corresponding projections of each of the static magnetic field generation sources aligns alternatively in positive and negative direction on the first straight line.

2. A magnet device in which two sets of static magnetic field generation sources, each being constituted by current carrying means and shielding current carrying means for suppressing leakage magnetic field to an external region disposed substantially concentrically with respect to a first direction in order to generate a uniform magnetic field directing in the first direction in a finite region, are disposed facing each other while placing the uniform magnetic field region therebetween and each of the static magnetic field generation sources is provided with at least four current carrying means and at least one shielding current carrying means, characterized in that when assuming a crossing point of a first axis which is in parallel with the first direction and passes substantially the center of the current carrying means and a second axis which crosses the first axis orthogonally and locates at substantially the equal distance from the two sets of the static magnetic field generation sources as a first point and further assuming a first straight line contained on a first plane defined by the first axis, the second axis and the first point and passing through the first point, the current carrying means are disposed in such a manner that, when geometrical centers of cross sections of the current carrying means on the first plane are projected on the first straight line, the current carrying direction of the current carrying means at the respective corresponding projections of each of the static magnetic field generation sources aligns alternatively in positive and negative direction on the first straight line.

3. A magnet device in which two sets of static magnetic field generation sources, each being constituted by current carrying means disposed substantially concentrically with respect to a first direction in order to generate a uniform magnetic field directing in the first direction in a finite region, are disposed facing each other while placing the uniform magnetic field region therebetween and each of the static magnetic field generation sources is provided with a ferromagnetic body functioning as a magnetic pole and at least two current carrying means, characterized in that when assuming a crossing point of a first axis which is in parallel with the first direction and passes substantially the center of the current carrying means and a second axis which crosses the first axis orthogonally and locates at substantially the equal distance from the two sets of the static magnetic field generation sources as a first point and further assuming a first straight line contained on a first plane defined by the first axis, the second axis and the first point and passing through the first point, the current carrying means are disposed in such a manner that, when geometrical centers of cross sections of the current carrying means on the first plane are projected on the first straight line, the current carrying direction of the current carrying means at the respective corresponding projections of each of the static magnetic field generation sources aligns alternatively in positive and negative direction on the first straight line.

4. A magnet device in which two sets of static magnetic field generation sources, each being constituted by current carrying means and shielding current carrying means for suppressing leakage magnetic field to an external region disposed substantially concentrically with respect to a first direction in order to generate a uniform magnetic field directing in the first direction in a finite region, are disposed facing each other while placing the uniform magnetic field region therebetween and each of the static magnetic field generation sources is provided with a ferromagnetic body functioning as a magnetic pole, at least two current carrying means and at least one shielding current carrying means, characterized in that when assuming a crossing point of a first axis which is in parallel with the first direction and passes substantially the center of the current carrying means and a second axis which crosses the first axis orthogonally and locates at substantially the equal distance from the two sets of the static magnetic field generation sources as a first point and further assuming a first straight line contained on a first plane defined by the first axis, the second axis and the first point and passing through the first point, the current carrying means are disposed in such a manner that, when geometrical centers of cross sections of the current carrying means on the first plane are projected on the first straight line, the current carrying direction of the current carrying means at the respective corresponding projections of each of the static magnetic field generation sources aligns alternatively in positive and negative direction on the first straight line.

5. A magnet device in which two sets of static magnetic field generation sources, each being constituted by current carrying means disposed substantially concentrically with respect to a first direction in order to generate a uniform magnetic field directing in the first direction in a finite region, are disposed facing each other while placing the uniform magnetic field region therebetween and each of the static magnetic field generation sources is provided with three current carrying means, characterized in that when assuming a crossing point of a first axis which is in parallel with the first direction and passes substantially the center of the current carrying means and a second axis which crosses the first axis orthogonally and locates at substantially the equal distance from the two sets of the static magnetic field generation sources as a first point and further assuming a first straight line contained on a first plane defined by the first axis, the second axis and the first point and passing through the first point, the current carrying means on the first plane are projected on the first straight line, the current carrying direction of the current carrying means at the respective corresponding projections of each of the static magnetic field generation sources aligns alternatively in positive and negative direction on the first straight line.

6. A magnet device in which two sets of static magnetic field generation sources, each being constituted by current carrying means and shielding current carrying means for suppressing leakage magnetic field to an external region disposed substantially concentrically with respect to a first direction in order to generate a uniform magnetic field directing in the first direction in a finite region, are disposed facing each other while placing the uniform magnetic field region therebetween and each of the static magnetic field generation sources is provided with three current carrying means and at least one shielding current carrying means, characterized in that when assuming a crossing point of a first axis which is in parallel with the first direction and passes substantially the center of the current carrying means and a second axis which crosses the first axis orthogonally and locates at substantially the equal distance from the two sets of the static magnetic field generation sources as a first point and further assuming a first straight line contained on a first plane defined by the first axis, the second axis and the first point and passing through the first point, the current carrying means are disposed in such a manner that, when geometrical centers of cross sections of the current carrying means on the first plane are projected on the first straight line, the current carrying direction of the current carrying means at the respective corresponding projections of each of the static magnetic field generation sources aligns alternatively in positive and negative direction on the first straight line.

7. A magnet device according to claim 1, characterized in that when the geometric centers of the cross sections of the current carrying means are projected on the first straight line on the first plane the absolute values of magnetomotive force of the current carrying means in the respective static magnetic field generation sources at the corresponding projections align on the first straight line in either descending order or ascending order.

8. A magnet device according to one of claim 5–6, characterized in that when the geometric centers of the cross sections of the current carrying means are projected on the second axis on the first plane, the absolute values of magnetomotive force of the current carrying means in the respective static magnetic field generation sources at the corresponding projections align on the second axis in either descending order or ascending order.

9. A magnet device according to claim 1, characterized in that in each of the static magnetic field generation sources, the absolute values of magnetomotive force of the current carrying means having the largest average radius among the current carrying means is larger than the absolute values of the magnetomotive force of other currently carrying means.

10. A magnet device according to claim 1, characterized in that each of the static magnetic field generation sources includes at least one ferromagnetic body which helps formation of the magnetic field.

11. A magnet device according to claim 10, characterized in that the ferromagnetic body functions as a magnetic pole.

12. A magnet device according to claim 1, characterized in that the magnetic device further comprises an external ferromagnetic body which covers the outside of the two sets of static magnetic field generation sources and forms a magnetic passage to suppress leakage magnetic field.

13. A magnet device according to claim 12, characterized in that the external ferromagnetic body includes a disk shaped ferromagnetic body and a column shaped ferromagnetic body.

14. A magnet device according to claim 1, characterized in that the current carrying means is constituted by a material having a super conducting property, and the two sets of static magnetic field generation sources includes a cooling means which cools the current carrying means to a temperature at which the current carrying means shows the super conducting property and maintains the same at the temperature.

15. An MRI device which uses the magnet device according to claim 1.

16. An MRI device including the magnet device according to claim 1, which applies the magnetic field in such a manner that the main magnetic flux direction is perpendicular with respect to the face of a stand on which a measurement object is laid.

17. A super conducting magnetic device for an open and vertical magnetic field type MRI device including a first and a second static magnetic field generation source which are disposed in vertical direction opposing each other while sandwiching a space for receiving a person to be inspected, each of the first and second static magnetic filed generation sources includes static magnetic filed generation use coil units of equal to or more than three which are arranged concentrically around the center axis in vertical direction thereof, characterized in that, the directions of DC current flow in the static magnetic field generation use coil units of equal to or more than three in each of the static magnetic field generation sources are determined alternative in positive and negative direction with reference to projection positions of geometric centers of cross sections of the respective coil units of equal to or more than three on a straight line passing through a crossing point, on a plane which is perpendicular to the central axis in vertical direction and contains a horizontal axis having an equal distance both from the first and second static magnetic field generation sources, of the center axis and the horizontal axis and at the side of the straight line away from the horizontal axis when viewed from the respective coil units of equal to or more than three.

18. A super conducting magnet device for an open and vertical magnetic field type MRI device including a pair of static magnetic field generation sources which are disposed in vertical direction opposing each other while sandwiching a space having a broad opening for receiving a person to be inspected, and each of the pair of static magnetic field generation sources includes a main coil unit for the static magnetic field generation having first diameter and being disposed concentrically with the center axis in vertical direction thereof, a plurality of coil units for irregular magnetic field correction each having a diameter smaller than the first diameter and being likely disposed concentrically with the center axis in vertical direction thereof and shielding coil unit for suppressing magnetic field leakage having substantially the same diameter as the first diameter and being disposed concentrically with the center axis in vertical direction thereof but being located distant position than the main coil unit for static magnetic field generation with respect to the space, characterized in that, the directions of DC current flow in the main coil unit for static magnetic field generation and the plurality of coil units for irregular magnetic filed correction in each of the static magnetic field generation sources are determined alternative in positive and negative direction with reference to projection positions of geometric centers of cross sections of the main coil unit for static magnetic field generation and the plurality of the coil units for irregular magnetic field correction on a straight line passing through a crossing point, on a plane which is perpendicular to the center axis in vertical direction and contains a horizontal axis having an equal distance both from the first and second static magnetic field generation sources, of the center axis and the horizontal axis and at the side of the straight line away from the horizontal axis when viewed from the main coil unit for static magnetic field generation and the plurality of coil units for irregular magnetic field correction, as well as the direction of DC current flow in the shielding coil unit is determined to be opposite to the direction of the DC current flow in the main coil unit for static magnetic field generation.

19. A magnetic device including a pair of static magnetic field generation sources for generating a uniform magnetic field directing in a first direction in a finite region each of the static magnetic field generation sources being provided with at least two current carrying means disposed concentrically, characterized in that, the at least two current carrying means are disposed concentrically while being spaced each other and further when assuming a crossing point of a first axis which is in parallel with the first direction and passes substantially the center of the current carrying means and a second axis which crosses the first axis orthogonally and locates at substantially the equal distance from the respective static magnetic field generation sources as a first point, the current carrying means are disposed in such a manner that when geometrical centers of cross sections of the current carrying means are projected on a first straight line on a first plane containing the first axis, the second axis and the first point and passing through the first point, the current carrying means at the respective corresponding projections aligns alternatively in positive and negative direction on the first straight line.

20. A super conducing magnetic device for an open and vertical magnetic field type MRI device including a first and a second static magnetic field generation source which are disposed opposing each other while sandwiching a space for receiving a person to be examined, each of the first and second static magnetic field generation sources includes static magnetic field generation use coil units of equal to or more than three which are arranged concentrically with the central axis passing through the center thereof, characterized in that, the static magnetic field generation use coil units of equal to or more than three in each of the static magnetic field generation sources are arranged in such a manner that within an angle range defined by a first line segment on a plane containing the center axis and extending in a direction perpendicular to the center axis from a center point on the center axis having substantially the same distance from both first and second static magnetic field generation sources and a second line segment extending from the center point toward the static magnetic field generation use coil unit located most inside and most close with respect to the space within the plane, when the geometric centers of the cross sections of the respective static magnetic field generation use coil units are projected on any straight line while locating the first line segment therebetween, the current flow directions of the static magnetic field generation use coil units at the respective corresponding projection points align alternatively in positive and negative direction on the straight line.

21. A super conducting magnet device for an open and vertical magnetic field type MRI device including a pair of static magnetic field generation sources which are disposed opposing each other while sandwiching a space having a broad opening for receiving a person to be examined, and each of the pair of static magnetic field generation sources includes a main coil unit for the static magnetic field generation having a first diameter and being disposed concentrically with the center axis passing the center of the static magnetic field generation sources, a plurality of coil units for irregular magnetic field correction each having diameter smaller than the first diameter and being disposed concentrically with the center axis thereof and a shielding coil unit for suppressing magnetic field leakage having substantially the same diameter as the first diameter and being disposed concentrically with the center axis thereof but being located distant position than the main coil unit for static magnetic field generation with respect to the space, characterized in that, the main coil unit for static magnetic field generation and the plurality of coil units for irregular magnetic field correction in each of the static magnetic field generation sources are arranged in such a manner that within an angle range defined by a first line segment on a plane containing the center axis and extending in a direction perpendicular to the center axis from a center point on the center axis having substantially the same distance from both first and second static magnetic field generation sources and a second line segment extending from the center point toward the coil unit for irregular magnetic field correction located most inside and most close with respect to the space within the plane, when the geometric centers of the cross sections of the main coil unit for static magnetic field generation and the plurality of unit coils for irregular magnetic field correction are projected on any straight line while locating the first line segment therebetween, the current flow directions of the mail coil unit for static magnetic field generation and the plurality of unit coils for irregular magnetic field correction at the respective corresponding projection points align alternatively in positive and negative direction on the straight line as well as the direction of DC current flow in the shielding coil unit is determined to be opposite to the direction of the DC current flow in the main coil unit for static magnetic field generation.

22. A magnet device according to claim 4, characterized in that each of the static magnetic field generation sources includes at least one ferromagnctic body which helps formation of the magnetic field.

23. A magnet device according to claim 5, characterized in that each of the static magnetic field generation sources includes at least one ferromagnetic body which helps formation of the magnetic field.

24. A magnet device according to claim 6, characterized in that each of the static magnetic field generation sources includes at least one ferromagnetic body which helps formation of the magnetic field.

25. A magnetic device according to claim 19, characterized in that a ferromagnetic body functions as a magnetic pole.

26. A magnetic device according to claim 20, characterized in that a ferromagnetic body functions as a magnetic pole.

27. A magnetic device according to claim 21, characterized in that a ferromagnetic body functions as a magnetic pole.

28. A magnetic device according to claim 22, characterized in that the ferromagnetic body functions as a magnetic pole.

29. A magnetic device according to claim 23, characterized in that the ferromagnetic body functions as a magnetic pole.

30. A magnetic device according to claim 24, characterized in that the ferromagnetic body functions as a magnetic pole.

31. A magnet device according to claim 1, characterized in that the magnetic device further comprises an external ferromagnetic body which covers the outside of the two sets of static magnetic field generation sources and forms a magnetic passage to suppress leakage magnetic field.

32. A magnet device according to claim 2, characterized in that the magnetic device further comprises an external ferromagnetic body which covers the outside of the two sets of static magnetic field generation sources and forms a magnetic passage to suppress leakage magnetic field.

33. A magnet device according to claim 3, characterized in that the magnetic device further comprises an external ferromagnetic body which covers the outside of the two sets of static magnetic field generation sources and forms a magnetic passage to suppress leakage magnetic field.

34. A magnet device according to claim 4, characterized in that the magnetic device further comprises an external ferromagnetic body which covers the outside of the two sets of static magnetic field generation sources and forms a magnetic passage to suppress leakage magnetic field.

35. A magnet device according to claim 5, characterized in that the magnetic device further comprises an external ferromagnetic body which covers the outside of the two sets of static magnetic field generation sources and forms a magnetic passage to suppress leakage magnetic field.

36. A magnet device according to claim 6, characterized in that the magnetic device further comprises an external ferromagnetic body which covers the outside of the two sets of static magnetic field generation sources and forms a magnetic passage to suppress leakage magnetic field.

37. A magnet device according to claim 31, characterized in that the external ferromagnetic body includes a disk shaped ferromagnetic body and a column shaped ferromagnetic body.

38. A magnet device according to claim 32, characterized in that the external ferromagnetic body includes a disk shaped ferromagnetic body and a column shaped ferromagnetic body.

39. A magnet device according to claim 33, characterized in that the external ferromagnetic body includes a disk shaped ferromagnetic body and a column shaped ferromagnetic body.

40. A magnet device according to claim 34, characterized in that the external ferromagnetic body includes a disk shaped ferromagnetic body and a column shaped ferromagnetic body.

41. A magnet device according to claim 35, characterized in that the external ferromagnetic body includes a disk shaped ferromagnetic body and a column shaped ferromagnetic body.

42. A magnet device according to claim 36, characterized in that the external ferromagnetic body includes a disk shaped ferromagnetic body and a column shaped ferromagnetic body.

43. A magnet device according to claim 1, characterized in that the current carrying means is constituted by a material having a super conducting property, and the two sets of static magnetic field generation sources includes a cooling means which cools the current carrying means to a temperature at which the current carrying means shows the super conducting property and maintains the same at the temperature.

44. A magnet device according to claim 2, characterized in that the current carrying means is constituted by a material having a super conducting property, and the two sets of static magnetic field generation sources includes a cooling means which cools the current carrying means to a temperature at which the current carrying means shows the super conducting property and maintains the same at the temperature.

45. A magnet device according to claim 3, characterized in that the current carrying means is constituted by a material having a super conducting property, and the two sets of static magnetic field generation sources includes a cooling means which cools the current carrying means to a temperature at which the current carrying means shows the super conducting property and maintains the same at the temperature.

46. A magnet device according to claim 4, characterized in that the current carrying means is constituted by a material having a super conducting property, and the two sets of static magnetic field generation sources includes a cooling means which cools the current carrying means to a temperature at which the current carrying means shows the super conducting property and maintains the same at the temperature.

47. A magnet device according to claim 5, characterized in that the current carrying means is constituted by a material having a super conducting property, and the two sets of static magnetic field generation sources includes a cooling means which cools the current carrying means to a temperature at which the current carrying means shows the super conducting property and maintains the same at the temperature.

48. A magnet device according to claim 6, characterized in that the current carrying means is constituted by a material having a super conducting property, and the two sets of static magnetic field generation sources includes a cooling means which cools the current carrying means to a temperature at which the current carrying means shows the super conducting property and maintains the same at the temperature.

49. An MRI device which uses the magnet device according to claim 1.

50. An MRI device which uses the magnet device according to claim 2.

51. An MRI device which uses the magnet device according to claim 3.

52. An MRI device which uses the magnet device according to claim 4.

53. An MRI device which uses the magnet device according to claim 5.

54. An MRI device which uses the magnet device according to claim 6.

55. An MRI device including the magnet device according to claim 1, which applies the magnetic field in such a manner that the main magnetic flux direction is perpendicular with respect to the face of a stand on which a measurement object is laid.

56. An MRI device including the magnet device according to claim 2, which applies the magnetic field in such a manner that the main magnetic flux direction is perpendicular with respect to the face of a stand on which a measurement object is laid.

57. An MRI device including the magnet device according to claim 3, which applies the magnetic field in such a manner that the main magnetic flux direction is perpendicular with respect to the face of the stand on which a measurement object is laid.

58. An MRI device including the magnet device according to claim 4, which applies the magnetic field in such a manner that the main magnetic flux direction is perpendicular with respect to the face of a stand on which a measurement object is laid.

59. An MRI device including the magnet device according to claim 5, which applies the magnetic field in such a manner that the main magnetic flux direction is perpendicular with respect to the face of a stand on which a measurement object is laid.

60. An MRI device including the magnet device according to claim 6, which applies the magnetic field in such a manner that the main magnetic flux direction is perpendicular with respect to the face of a stand on which a measurement object is laid.

61. A super conducting magnetic device for an open and vertical magnetic field type MRI device including a first and a second static magnetic field generation source which are disposed in vertical direction opposing each other while sandwiching a space for receiving a person to be inspected, each of the first and second static magnetic field generation sources includes static magnetic field generation use coil units of equal to or more than three which are arranged concentrically around the center axis in vertical direction thereof, characterized in that, the directions of DC current flow in the static magnetic field generation use coil units of equal to or more than three in each of the static magnetic field generation sources are determined alternative in positive and negative direction with reference to projection positions of geometric centers of cross sections of the respective coil units of equal to or more than three on a straight line passing through a crossing point, on a plane which is perpendicular to the center axis in vertical direction and contains a horizontal axis having an equal distance both from the first and second static magnetic field generation sources, of the center axis and the horizontal axis and at the side of the straight line away from the horizontal axis when viewed from the respective coil units of equal to or more than three.

62. A super conducting magnet device for an open and vertical magnetic field type MRI device including a pair of static magnetic field generation sources which are disposed in vertical direction opposing each other while sandwiching a space having a broad opening for receiving a person to be inspected, and each of the pair of static magnetic field generation sources includes a main coil unit for the static magnetic field generation having a first diameter and being disposed concentrically with the center axis in vertical direction thereof, a plurality of coil units for irregular magnetic field correction each having a diameter smaller than the first diameter and being likely disposed concentrically with the center axis in vertical direction thereof and a shielding coil unit for suppressing magnetic field leakage having substantially the same diameter as the first diameter and being disposed concentrically with the center axis in vertical direction thereof but being located distant position than the main coil unit for static magnetic field generation with respect to the space, characterized in that, the directions of DC current flow in the main coil unit for static magnetic field generation and the plurality of coil units for irregular magnetic field correction in each of the static magnetic field generation sources are determined alternative in positive and negative direction with reference to projection positions of geometric centers of cross sections of the main coil unit for static magnetic field generation and the plurality of the coil units for irregular magnetic field correction on a straight line passing through a crossing point, on a plane which is perpendicular to the center axis in vertical direction and contains a horizontal axis having an equal distance both from the first and second static magnetic field generation sources, of the center axis and the horizontal axis and at the side of the straight line away from the horizontal axis when viewed from the main coil unit for static magnetic field generation and the plurality of coil units for irregular magnetic field correction, as well as the direction of DC current flow in the shielding coil unit is determined to be opposite to the direction of the DC current flow in the main coil unit for static magnetic field generation.

63. A superconducting magnet device including a pair of static magnetic field generation sources for generating a uniform magnetic field directing in a first direction in a finite region each of the static magnetic field generation sources being provided with at least two current carrying means disposed concentrically, characterized in that, the at least two current carrying means are disposed concentrically while being spaced each other and further when assuming a crossing point of a first axis which is in parallel with the first direction and passes substantially the center of the current carrying means and a second axis which crosses the first axis orthogonally and locates at substantially the equal distance from the respective static magnetic field generation sources as a first point, the current carrying means are disposed in such a manner that when geometrical centers of cross sections of the current carrying means are projected on a first straight line on a first plane containing the first axis, the second axis and the first point and passing through the first point, the current carrying means at the respective corresponding projections aligns alternatively in positive and negative direction on the first straight line.

64. A super conducting magnetic device for an open and vertical magnetic field type MRI device including a first and a second static magnetic field generation source which are disposed opposing each other while sandwiching a space for receiving a person to be examined, each of the first and second static magnetic center axis passing through the center thereof, characterized in that, the static magnetic field generation use coil units of equal to or more than three in each of the static magnetic field generation sources are arranged in such a manner that within an angle range defined by a first line segment on a plane containing the center axis and extending in a direction perpendicular to the center axis from a center point on the center axis having substantially the same distance from both first and second static magnetic field generation sources and a second line segment extending from the center point toward the static magnetic field generation use coil unit located most inside and most close with respect to the space within the plane, when the geometric centers of the cross sections of the respective static magnetic field generation use coil units are projected on any straight line while locating the first line segment therebetween, the current flow directions of the static magnetic field generation use coil units at the respective corresponding projection points align alternatively in positive and negative direction on the straight line.

65. A super conducting magnet device for an open and vertical magnetic field type MRI device including a pair of static magnetic field generation sources which are disposed opposing each other while sandwiching a space having a broad opening for receiving a person to be examined, and each of the pair of static magnetic field generation sources includes a main coil unit for the static magnetic field generation having a first diameter and being disposed concentrically with the center axis passing the center of the static magnetic field generation sources, a plurality of coil units for irregular magnetic field correction each having a diameter smaller than the first diameter and being disposed concentrically with the center axis thereof and a shielding coil unit for suppressing magnetic field leakage having substantially the same diameter as the first diameter and being disposed concentrically with the center axis thereof but being located distant position than the main coil unit for static magnetic field generation with respect to the space, characterized in that, the main coil unit for static magnetic field generation and the plurality of coil units for irregular magnetic field correction in each of the static magnetic field generation sources are arranged in such a manner that within an angle range defined by a first line segment on a plane containing the center axis and extending in a direction perpendicular to the center axis from a center point on the center axis having substantially the same distance from both first and second static magnetic field generation sources and a second line segment extending from the center point the coil unit for irregular magnetic field correction located most inside and most close with respect to the space within the plane, when the geometric centers of the cross sections of the main coil unit for static magnetic field generation and the plurality of unit coils for irregular magnetic field correction are projected on any straight line while locating the first line segment therebetween, the current flow directions of the main coil unit for static magnetic field generation and the plurality of unit coils for irregular magnetic field correction at the respective corresponding projection points align alternatively in positive and negative direction on the straight line as well as the direction of DC current flow in the shielding coil unit is determined to be opposite to the direction of the DC current flow in the main coil unit for static magnetic field generation.

* * * * *